United States Patent
Ohnuma et al.

(10) Patent No.: US 8,394,703 B2
(45) Date of Patent: Mar. 12, 2013

(54) MANUFACTURING METHOD OF SOI SUBSTRATE AND MANUFACTURING METHOD OF SEMICONDUCTOR DEVICE

(75) Inventors: Hideto Ohnuma, Atsugi (JP); Junpei Momo, Sagamihara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 504 days.

(21) Appl. No.: 12/634,107

(22) Filed: Dec. 9, 2009

(65) Prior Publication Data

US 2010/0151663 A1 Jun. 17, 2010

(30) Foreign Application Priority Data

Dec. 15, 2008 (JP) ................. 2008-318377

(51) Int. Cl.
*H01L 21/762* (2006.01)

(52) U.S. Cl. ........ 438/406; 438/458; 438/459; 438/795; 257/E21.122; 257/E21.328; 257/E21.568; 257/E21.569

(58) Field of Classification Search ................ 438/406, 438/407, 458, 459, 795; 257/E21.122, E21.328, 257/E21.568, E21.569
See application file for complete search history.

(56) References Cited

U.S. PATENT DOCUMENTS

| 5,374,564 | A | 12/1994 | Bruel |
| 5,643,826 | A | 7/1997 | Ohtani et al. |
| 5,923,962 | A | 7/1999 | Ohtani et al. |
| 5,970,368 | A | 10/1999 | Sasaki et al. |
| 5,970,369 | A | 10/1999 | Hara et al. |
| 6,117,700 | A | 9/2000 | Orita et al. |
| 6,285,042 | B1 | 9/2001 | Ohtani et al. |
| 6,335,231 | B1 | 1/2002 | Yamazaki et al. |
| 6,335,541 | B1 | 1/2002 | Ohtani et al. |
| 6,350,703 | B1 | 2/2002 | Sakaguchi et al. |
| 6,380,046 | B1 | 4/2002 | Yamazaki |
| 6,444,506 | B1 | 9/2002 | Kusumoto et al. |
| 6,534,380 | B1 | 3/2003 | Yamauchi et al. |

(Continued)

FOREIGN PATENT DOCUMENTS

| EP | 0651431 A | 5/1995 |
| EP | 1158580 A | 11/2001 |

(Continued)

OTHER PUBLICATIONS

Zehner.D et al., "Preparation of atomically clean silicon surfaces by pulsed laser irradiation,", Appl. Phys. Lett. (Applied Physics Letters), 1980, vol. 36, No. 1, pp. 56-59.

*Primary Examiner* — Zandra Smith
*Assistant Examiner* — Toniae Thomas
(74) *Attorney, Agent, or Firm* — Eric J. Robinson; Robinson Intellectual Property Law Office, P.C.

(57) ABSTRACT

When the single crystal semiconductor layer is melted, the outward diffusion of oxygen is promoted. Specifically, an SOI substrate is formed in such a manner that an SOI structure having a bonding layer including oxygen provided over a base substrate and a single crystal semiconductor layer provided over the bonding layer including oxygen is formed, and part of the single crystal semiconductor layer is melted by irradiation with a laser beam in a state that the base substrate is heated at a temperature of higher than or equal to 500° C. and lower than a melting point of the base substrate.

22 Claims, 18 Drawing Sheets

U.S. PATENT DOCUMENTS

| | | |
|---|---|---|
| 6,611,005 B2 | 8/2003 | Tsujimura et al. |
| 6,677,222 B1 | 1/2004 | Mishima et al. |
| 6,803,264 B2 | 10/2004 | Yamazaki et al. |
| 6,803,296 B2 | 10/2004 | Miyairi |
| 6,861,377 B1 | 3/2005 | Hirai et al. |
| 6,998,639 B2 | 2/2006 | Ohtani et al. |
| 7,052,943 B2 | 5/2006 | Yamazaki et al. |
| 7,119,365 B2 | 10/2006 | Takafuji et al. |
| 7,153,729 B1 | 12/2006 | Yamazaki et al. |
| RE39,484 E | 2/2007 | Bruel |
| 7,199,024 B2 | 4/2007 | Yamazaki |
| 7,253,032 B2 | 8/2007 | Yamazaki et al. |
| 7,473,592 B2 | 1/2009 | Yamazaki et al. |
| 7,473,971 B2 | 1/2009 | Yamazaki et al. |
| 7,476,576 B2 | 1/2009 | Yamazaki et al. |
| 7,485,586 B2 | 2/2009 | Yamazaki et al. |
| 7,579,654 B2 | 8/2009 | Couillard et al. |
| 7,638,805 B2 | 12/2009 | Yamazaki et al. |
| 7,642,598 B2 | 1/2010 | Yamazaki et al. |
| 7,667,235 B2 | 2/2010 | Yamazaki et al. |
| 7,674,647 B2 | 3/2010 | Arai |
| 7,714,251 B2 | 5/2010 | Miyairi |
| 7,745,268 B2 | 6/2010 | Miyairi |
| 7,776,718 B2 | 8/2010 | Tanaka |
| 7,790,572 B2 | 9/2010 | Moriwaka |
| 7,795,111 B2 | 9/2010 | Shimomura et al. |
| 7,799,658 B2 | 9/2010 | Yamazaki |
| 7,816,736 B2 | 10/2010 | Yamazaki |
| 7,834,398 B2 | 11/2010 | Yamazaki |
| 7,851,318 B2 | 12/2010 | Koyama et al. |
| 7,858,431 B2 | 12/2010 | Isaka et al. |
| 2002/0006689 A1 | 1/2002 | Miyasaka |
| 2002/0022348 A1 | 2/2002 | Sakaguchi et al. |
| 2002/0109144 A1 | 8/2002 | Yamazaki |
| 2002/0137265 A1 | 9/2002 | Yamazaki et al. |
| 2004/0147095 A1 | 7/2004 | Yamazaki |
| 2005/0009252 A1 | 1/2005 | Yamazaki et al. |
| 2006/0131583 A1 | 6/2006 | Ohtani et al. |
| 2006/0278876 A1 | 12/2006 | Yamazaki et al. |
| 2007/0117288 A1 | 5/2007 | Miyairi |
| 2007/0173000 A1 | 7/2007 | Yamazaki |
| 2007/0184632 A1 | 8/2007 | Yamazaki et al. |
| 2008/0054269 A1 | 3/2008 | Yamazaki et al. |
| 2008/0061301 A1 | 3/2008 | Yamazaki |
| 2008/0067529 A1 | 3/2008 | Yamazaki |
| 2008/0067596 A1 | 3/2008 | Yamazaki et al. |
| 2008/0067597 A1 | 3/2008 | Yamazaki |
| 2008/0070335 A1 | 3/2008 | Yamazaki et al. |
| 2008/0083953 A1 | 4/2008 | Yamazaki |
| 2008/0113487 A1 | 5/2008 | Yamazaki et al. |
| 2008/0113488 A1 | 5/2008 | Yamazaki et al. |
| 2008/0246109 A1 | 10/2008 | Ohnuma et al. |
| 2008/0286911 A1 | 11/2008 | Miyairi |
| 2008/0299743 A1 | 12/2008 | Miyairi |
| 2008/0315350 A1 | 12/2008 | Tanaka |
| 2009/0004821 A1 | 1/2009 | Shimomura et al. |
| 2009/0029525 A1 | 1/2009 | Ohnuma |
| 2009/0093102 A1 | 4/2009 | Motiwaka |
| 2009/0098710 A1 | 4/2009 | Yamazaki |
| 2009/0115029 A1 | 5/2009 | Koyama |
| 2009/0117680 A1 | 5/2009 | Yamazaki et al. |
| 2009/0137095 A1 * | 5/2009 | Shimomura et al. .......... 438/455 |
| 2009/0142874 A1 | 6/2009 | Arai |
| 2009/0142879 A1 | 6/2009 | Isaka et al. |
| 2009/0142908 A1 | 6/2009 | Isaka et al. |
| 2009/0269875 A1 | 10/2009 | Kato et al. |
| 2010/0029058 A1 | 2/2010 | Shimomura et al. |
| 2011/0212596 A1 | 9/2011 | Shimomura et al. |

FOREIGN PATENT DOCUMENTS

| | | |
|---|---|---|
| JP | 11-163363 A | 6/1999 |
| JP | 2005-252244 | 9/2005 |
| JP | 2008-277789 | 11/2008 |

* cited by examiner

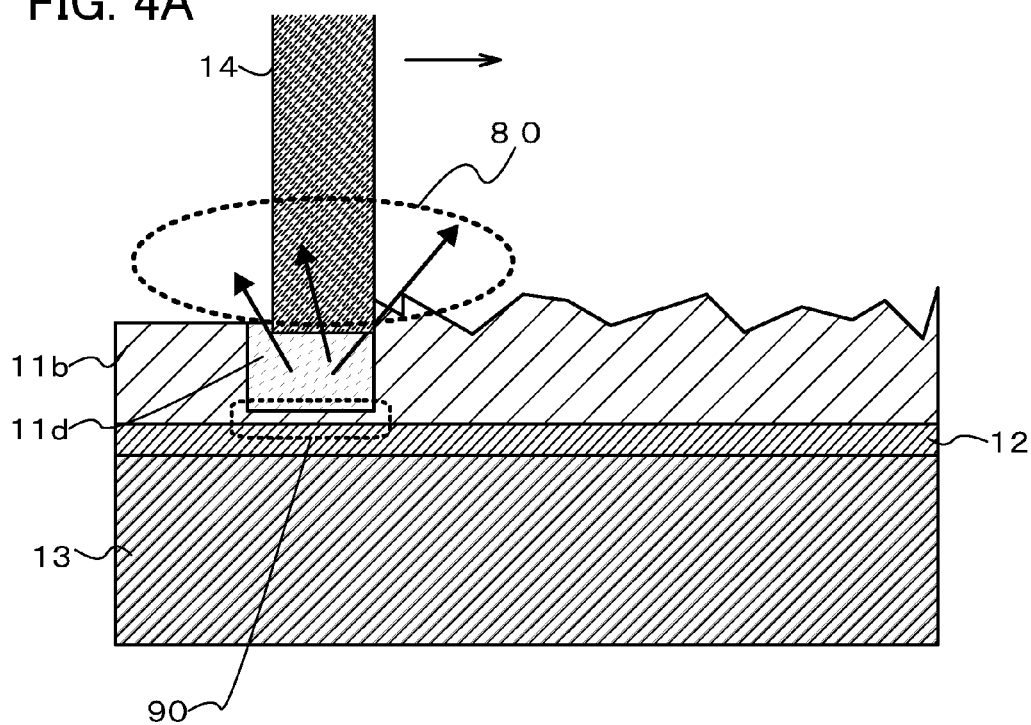
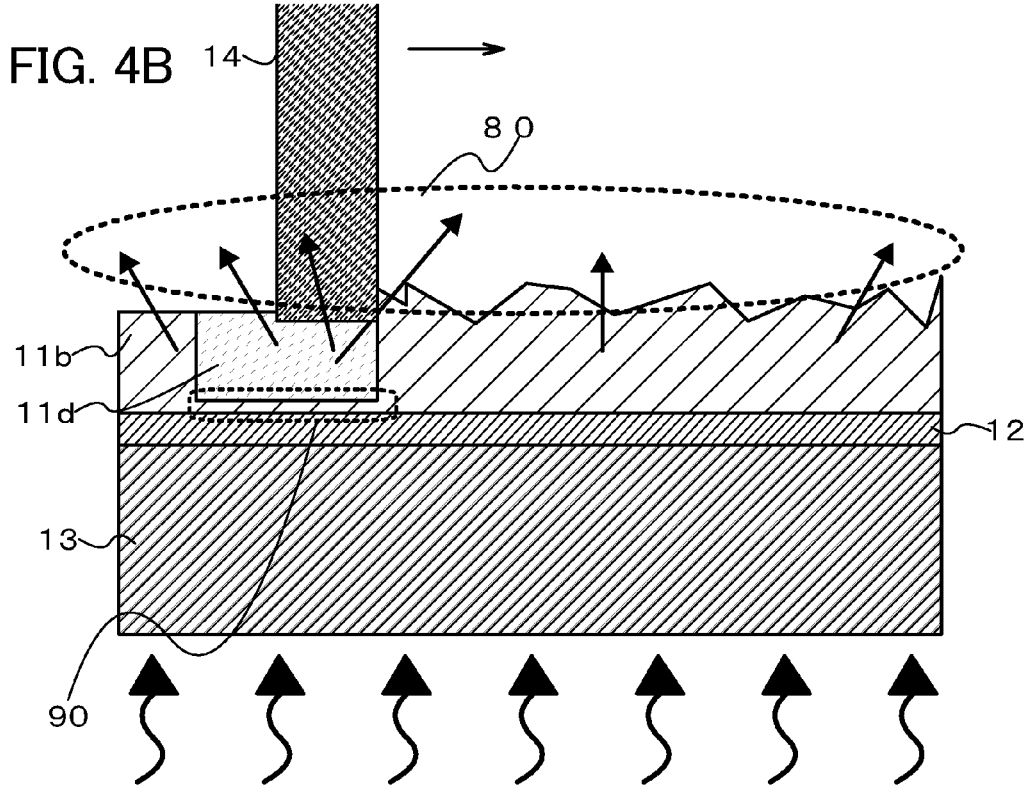

MANUFACTURING METHOD OF SOI SUBSTRATE AND MANUFACTURING METHOD OF SEMICONDUCTOR DEVICE

BACKGROUND OF THE INVENTION

1. Field of the Invention

The technical field relates to a silicon-on-insulator (SOI) structure.

2. Description of the Related Art

As a method for forming a transistor, the following methods are known: a method in which a silicon wafer is used, a method in which a non-single-crystal semiconductor layer provided over a substrate having an insulating surface is used, a method in which a substrate (SOI substrate) having a thin single crystal semiconductor layer provided over an insulating surface is used, and the like.

In particular, a transistor formed using an SOI substrate can have higher performance than a transistor formed by other methods.

Here, a Smart Cut (registered trademark) method is known as a method for manufacturing an SOI substrate.

The Smart Cut method is a method for forming an SOI substrate approximately through the following process.

First, a silicon wafer is irradiated with hydrogen ions, and an embrittlement region (also referred to as a microbubble layer, a separation layer, a peeling layer, or the like) is formed at a predetermined depth from a surface of the silicon wafer.

Next, an insulating layer to serve as a bonding layer is formed on the surface of the silicon wafer.

Then, the bonding layer and a base substrate are bonded to each other and heat treatment is performed thereon, whereby a crack is generated from the microbubble layer. Accordingly, part of the silicon wafer is separated, and a single crystal semiconductor layer formed using the part of the silicon wafer is provided over the substrate.

As for a method for manufacturing such an SOI substrate, refer to Reference 1.

[Reference]

Reference 1: Japanese Published Patent Application No. 2008-277789

SUMMARY OF THE INVENTION

There is a phenomenon called oxygen precipitation in some cases when a large amount of oxygen is included in silicon.

The oxygen precipitation has a merit that contaminant metal impurities are gettered, and the oxygen precipitation has a demerit that performance of a transistor is deteriorated.

When a transistor is formed using a silicon wafer, oxygen precipitation occurs at a deep portion (a depth of about several micrometers to several tens of micrometers) from a surface while oxygen precipitation does not occur at a shallow portion (several tens of nanometers to several hundreds of nanometers) from the surface, whereby the demerit of oxygen precipitation can be avoided so as to make use of the merit thereof.

However, as for an SOI substrate, a single crystal semiconductor layer has a small thickness (several tens of nanometers to several hundreds of nanometers); therefore, when oxygen precipitation occurs, it is difficult to avoid the demerit that the performance of a transistor is deteriorated.

Accordingly, as for the SOI substrate, it is preferable that oxygen concentration in silicon be low in order to prevent oxygen precipitation as much as possible.

In view of the foregoing problem, a method for manufacturing an SOI substrate in which oxygen concentration in a single crystal semiconductor layer is reduced will be disclosed.

In addition, a semiconductor device manufactured using an SOI substrate and a manufacturing method thereof will be disclosed.

Note that a semiconductor device manufactured using an SOI substrate and a manufacturing method of the semiconductor device, which are disclosed below, solve specific problems in some cases.

Therefore, the solution to the specific problems can also apply to a semiconductor device manufactured using an SOI substrate other than an SOI substrate in which oxygen concentration is reduced.

An oxygen diffusion coefficient in a melted state is higher than that in a solid-phase state. Therefore, in an SOI structure having a base substrate, an insulating layer (bonding layer) formed over the base substrate, and a single crystal semiconductor layer formed over the insulating layer (bonding layer), the single crystal semiconductor layer (single crystal semiconductor layer including silicon as its main component) is in a melted state, so that the outward diffusion of oxygen in the single crystal semiconductor layer can be promoted.

Therefore, when the single crystal semiconductor layer of the SOI structure is irradiated with a laser beam to melt the single crystal semiconductor layer, an oxygen diffusion coefficient becomes high. Accordingly, the outward diffusion of oxygen can be promoted.

This is because the promotion of the outward diffusion of oxygen causes oxygen concentration in the single crystal semiconductor layer to decrease.

It is preferable to emit a laser beam while the base substrate is heated.

That is, when a laser beam is emitted while the base substrate is heated, the single crystal semiconductor layer is also heated.

Then, when a laser beam is emitted while the single crystal semiconductor layer is heated, the cooling rate of the single crystal semiconductor layer which is melted is decreased; therefore, the melting time of the single crystal semiconductor layer can be lengthened.

If the melting time of the single crystal semiconductor layer is lengthened, the time of retaining a melted state with a high diffusion coefficient of oxygen is lengthened; therefore, the outward diffusion of oxygen can be further promoted.

Accordingly, a laser beam is preferably emitted while the base substrate is heated, because a promoting effect of the outward diffusion of oxygen due to irradiation with a laser beam can be encouraged.

Note that when the temperature of the base substrate is higher than or equal to 500° C., oxygen can be reduced as compared with the case where the base substrate is not heated.

As the temperature of the base substrate is higher, the cooling rate of the semiconductor in a melted state can be slowed down; therefore, the temperature of the base substrate is preferably high.

In addition, in the case where the insulating layer which is in contact with the single crystal semiconductor layer is formed using an insulating film including oxygen (thermally oxidized film, silicon oxide film, silicon nitride oxide film, silicon oxynitride film, aluminum oxide film, aluminum nitride oxide film, aluminum oxynitride film, or the like), when the semiconductor which is in a melted state is in contact with the insulating film including oxygen, there arises a problem in that oxygen in the insulating film including oxygen diffuses into the semiconductor in a melted state.

Note that a nitride oxide film means a film of which nitrogen concentration is higher than oxygen concentration, and an oxynitride film means a film of which nitrogen concentration is lower than oxygen concentration.

Accordingly, when the insulating layer which is in contact with the single crystal semiconductor layer is an insulating layer including oxygen, the irradiation is preferably performed with a laser beam having energy density such that the bottom portion of the single crystal semiconductor layer is in a solid-phase state.

That is, it is preferable to partly melt the single crystal semiconductor layer by the irradiation with the laser beam.

Partly melting means that the bottom portion of the single crystal semiconductor layer is in a solid-phase state and a region over the bottom portion is in a melted state.

This is because the following reason: when the single crystal semiconductor layer is partly melted by the irradiation with a laser beam, a semiconductor in a solid-phase state with a lower diffusion coefficient of oxygen than a semiconductor in a melted state can be interposed between the semiconductor in a melted state and the insulating film including oxygen; as a result, oxygen in the insulating film including oxygen can be prevented from diffusing into the semiconductor in a melted state.

Note that the problem in that oxygen in a base diffuses into the semiconductor in a melted state also occurs in the case where the base substrate is a substrate including oxygen, such as a glass substrate or a quartz substrate, when the single crystal semiconductor layer is directly bonded to the base substrate.

Of insulating films including oxygen (thermally oxidized film, silicon oxide film, silicon nitride oxide film, silicon oxynitride film, aluminum oxide film, aluminum nitride oxide film, aluminum oxynitride film, and the like), the thermal conductivity of the silicon oxide film, the silicon nitride oxide film, the silicon oxynitride film, and the like is lower than that of the aluminum oxide film, the aluminum nitride oxide film, the aluminum oxynitride film, and the like.

On the other hand, the results of calculation based on computational science performed by the present inventors indicate that the thermal diffusion of the single crystal semiconductor layer preferentially occurs on the base side.

Accordingly, a substance having a low thermal conductivity is arranged on the base side of the single crystal semiconductor layer, whereby thermal diffusion to the base side can be suppressed. Therefore, the cooling rate of the single crystal semiconductor layer can be slowed down.

Therefore, in terms of extending the time of retaining a melted state, as for an insulating film including oxygen, a thermally oxidized film, a silicon oxide film, a silicon nitride oxide film, a silicon oxynitride film, or the like is preferable because these films have low thermal conductivity.

Note that the thermal conductivity of a glass substrate, a quartz substrate, or the like is lower than that of a silicon wafer; therefore, a glass substrate, a quartz substrate, or the like is preferably used as the base substrate in terms of retaining a melted state for a long time.

When a method such as lamp heating or induction heating is used as a heating method for the base substrate, it is preferable to select a base substrate which can be subjected to lamp heating, induction heating, or the like. Alternatively, contact heating may be used.

Further, an irradiation atmosphere of a laser beam is preferably set to a reduced-pressure atmosphere (an atmosphere in which air pressure is less than or equal to $10^{-3}$ Pa) because the entry of oxygen from the atmosphere can be prevented.

In addition, an irradiation atmosphere of a laser beam is preferably set to a reducing atmosphere (an atmosphere including hydrogen, an atmosphere including carbon monoxide, an atmosphere including hydrogen iodide, or the like) because a reduction reaction occurs so that the outward diffusion of oxygen can be encouraged.

Further, it is preferable to use a reduced-pressure atmosphere and a reducing atmosphere because an effect of reducing oxygen is further increased.

The causes of increasing the amount of oxygen in the single crystal semiconductor layer are thought to be the use of an inexpensive single crystal semiconductor substrate (a silicon wafer or the like) in which oxygen concentration is not precisely controlled, or addition of hydrogen, helium, or the like by an ion doping method in which mass separation is not performed, for example.

Accordingly, a method by which the outward diffusion of oxygen is encouraged is particularly effective in the case where an inexpensive single crystal semiconductor substrate (a silicon wafer or the like) in which oxygen concentration is not precisely controlled is used, or in the case where hydrogen, helium, or the like is added by an ion doping method in which mass separation is not performed, for example.

On the other hand, when an ion doping method is compared with an ion implantation method, mass separation is not performed in the ion doping method; therefore, a mass separator is not required for an apparatus used in the ion doping method.

When a mass separator is used, it is necessary to bend an ion beam, and it is difficult to increase a cross-sectional area of the ion beam. Moreover, when a mass separator is used, an ion current is decreased; therefore, only a small region can be irradiated with ions. On the other hand, in an ion doping method, since ion irradiation is performed but mass separation is not performed, a large ion current can be used; therefore, a large substrate can be irradiated with ions.

Further, when doping is performed using a hydrogen gas as a source gas by an ion doping method, an object to be irradiated can be irradiated with a large amount of $H_3^+$ ions among $H^+$ ions, $H_2^+$ ions, and $H_3^+$ ions.

Since $H_3^+$ splits into $H^+$ or H to be introduced into the object to be irradiated, introduction efficiency of hydrogen, helium, or the like can be improved as compared with the case where the object to be irradiated is irradiated with $H^+$ or $H_2^+$.

When a large amount of hydrogen, helium, or the like is introduced into an embrittlement region, a single crystal semiconductor substrate is surely separated; therefore, it is preferable to improve the introduction efficiency of hydrogen, helium, or the like.

When an ion doping method is used, a large region can be irradiated with ions; therefore, a plurality of small substrates can be processed at the same time.

However, since an ion doping method is a method in which hydrogen, helium, or the like is added to the object to be irradiated and mass separation is not performed, impurities other than hydrogen, helium, or the like in a doping atmosphere are also added to the object to be irradiated.

That is, when the object to be irradiated is doped with hydrogen by an ion doping method, the object to be irradiated is also doped with oxygen in the doping atmosphere; therefore, oxygen concentration in the object to be irradiated increases.

Accordingly, a method by which the outward diffusion of oxygen is encouraged is particularly effective in the case where an inexpensive single crystal semiconductor substrate (a silicon wafer or the like) in which oxygen concentration is not precisely controlled is used, or in the case where hydrogen, helium, or the like is added by an ion doping method in which mass separation is not performed, for example.

Needless to say, in terms of preventing oxygen precipitation, a method by which the outward diffusion of oxygen is encouraged is preferably applied also to the case where an expensive single crystal semiconductor substrate (a silicon wafer or the like) in which oxygen concentration is precisely controlled is used, or in the case where hydrogen, helium, or the like is added by an ion implantation method in which mass separation is performed, for example.

That is, it is preferable to form an SOI structure having a base substrate, a bonding layer including oxygen provided over the base substrate, and a single crystal semiconductor layer provided over the bonding layer including oxygen, in which the single crystal semiconductor layer is irradiated with a laser beam to be partly melted while the base substrate is heated at a temperature higher than or equal to 500° C. and lower than a melting point of the base substrate so that an SOI substrate is formed.

An irradiation atmosphere of the laser beam is preferably a reduced-pressure atmosphere.

An irradiation atmosphere of the laser beam preferably includes a reducing gas.

An irradiation atmosphere of the laser beam preferably includes a hydrogen fluoride gas.

When the irradiation atmosphere of the laser beam includes a hydrogen fluoride gas, the SOI structure is preferably exposed to an atmosphere including a hydrogen fluoride gas after the formation of the SOI structure and before the irradiation with the laser beam.

At the time of the irradiation with the laser beam, the base substrate is preferably heated by light irradiation or induction heating.

It is particularly effective in the case where an embrittlement region is formed in a single crystal semiconductor substrate by an ion doping method in which mass separation is not performed and then the embrittlement region is subjected to heat treatment, so that part of the single crystal semiconductor substrate is separated to form the single crystal semiconductor layer.

In addition, it is particularly effective in the case where the single crystal semiconductor layer is formed from bulk silicon which is formed by a Czochralski method (Cz method).

It is preferable to form a semiconductor element (a transistor or the like) using an SOI substrate with reduced oxygen concentration because a semiconductor device with high performance can be manufactured with high yield.

A single crystal semiconductor layer of an SOI substrate is irradiated with a laser beam, whereby a semiconductor in a melted state having a high diffusion coefficient of oxygen can be formed. Therefore, the outward diffusion of oxygen in the semiconductor occurs, and oxygen in the single crystal semiconductor layer can be reduced.

Further, it is preferable to emit a laser beam while the base substrate of the SOI substrate is heated because a promoting effect of the outward diffusion of oxygen due to irradiation with a laser beam can be encouraged.

In the case where an insulating film which is in contact with a single crystal semiconductor layer is an insulating film including oxygen, it is preferable to perform irradiation using a laser beam with energy density such that the bottom portion of the single crystal semiconductor layer is in a solid-phase state because oxygen in the insulating film including oxygen can be prevented from diffusing into the semiconductor in a melted state.

An irradiation atmosphere of a laser beam is a reduced-pressure atmosphere or a reducing atmosphere, whereby an effect of reducing oxygen can be encouraged.

Accordingly, a method by which the outward diffusion of oxygen is encouraged is particularly effective in the case where an inexpensive single crystal semiconductor substrate (a silicon wafer or the like) in which oxygen concentration is not precisely controlled is used, or in the case where hydrogen, helium, or the like is added by an ion doping method in which mass separation is not performed, for example.

BRIEF DESCRIPTION OF THE DRAWINGS

FIGS. 4A and 4B illustrate an example of a method for manufacturing an SOI substrate.

DETAILED DESCRIPTION OF THE INVENTION

Figure 1A:
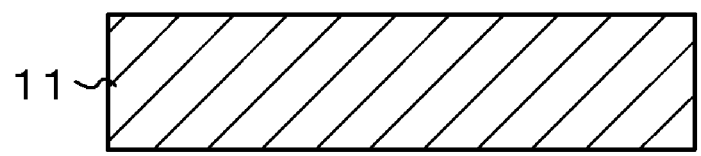
FIGS. 1A to 1C illustrate an example of a method for manufacturing an SOI substrate.

Embodiments will be described below.

It is easily understood by those skilled in the art that modes and details thereof can be modified in various ways without departing from the spirit and scope of the present invention. Therefore, the present invention should not be interpreted as being limited to what is described in the embodiments described below.

Note that in the structures described below, like portions or portions having a similar function are denoted by like reference numerals, and the description thereof is omitted.

The following embodiments can be combined with each other, as appropriate.

Note that a semiconductor device manufactured using an SOI substrate and a manufacturing method of the semiconductor device, which are disclosed below, solve specific problems in some cases.

Accordingly, a technique to solve the above specific problems can be combined with any of techniques disclosed in the following embodiments if an effect by this technique is not lost.

(Embodiment 1)

In this embodiment, an example of a method for forming an SOI substrate will be described.

First, a single crystal semiconductor substrate 11 is prepared (FIG. 1A).

The single crystal semiconductor substrate 11 can be formed using a substrate including silicon as its main component.

As the substrate including silicon as its main component, a silicon wafer, a silicon wafer to which germanium is added, or the like can be used.

Note that as the substrate including silicon as its main component, any substrate can be used as long as it includes silicon as its main component even when an impurity other than germanium is added.

An impurity element for controlling a resistance value of a donor element, an acceptor element, or the like may be added to the substrate including silicon as its main component.

Figure 1B:
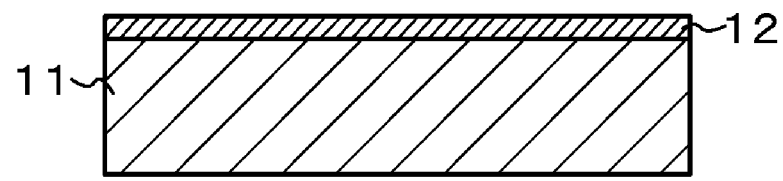

Next, a bonding layer 12 is formed over the single crystal semiconductor substrate 11 (FIG. 1B).

Note that as the bonding layer 12, any layer can be used as long as it has a smooth surface which is exposed and an insulating surface which is in contact with the single crystal semiconductor substrate 11.

Therefore, the bonding layer 12 may have a single layer structure or a stacked structure.

As the bonding layer 12, a thermally oxidized film which is formed in such a manner that a surface of the single crystal semiconductor substrate 11 or a surface of a base substrate is thermally oxidized; a silicon oxide film, a silicon nitride film, a silicon oxynitride film, a silicon nitride oxide film, or the like which is formed by a CVD method, a sputtering method, or the like can be used.

In particular, in the case where a thermally oxidized film is formed in such a manner that the surface of the single crystal semiconductor substrate 11 or the surface of the base substrate is thermally oxidized, when thermal oxidation is performed in an atmosphere including halide (hydrogen chloride or the like), a halogen can be added to the thermally oxidized film.

Note that the halogen has an effect of gettering a metal impurity or the like.

Note that when a thermally oxidized film is used as the bonding layer, the thermally oxidized film is formed on the surface, rear surface, and side surfaces of the single crystal semiconductor substrate 11.

On the other hand, when a film formed by a CVD method, a sputtering method, or the like is used as the bonding layer, the bonding layer may be formed at least on the surface.

A thermally oxidized film including a halogen is preferable because gettering of movable ions of sodium or the like can be performed.

When the bonding layer 12 has a stacked structure, in addition to the above materials, a metal film may be used.

The reason why the surface which is exposed has smoothness is because bonding with the surface of the base substrate which is in contact with the bonding layer is strengthened.

Note that it is preferable that an average surface roughness (Ra) be less than or equal to 0.50 nm when measurement is performed by an atomic force microscope (AFM) (more preferably, the average surface roughness is less than or equal to 0.35 nm (still more preferably, the average surface roughness is less than or equal to 0.20 nm)).

Note that smoothness of a base has an influence on the average surface roughness. Therefore, when the bonding layer 12 has a stacked structure, it is preferable to form a stacked structure so that the average surface roughness (Ra) on the surface of the bonding layer 12 which is exposed is less than or equal to 0.50 nm (more preferably, the average surface roughness is less than or equal to 0.35 nm (still more preferably, the average surface roughness is less than or equal to 0.20 nm)).

Note that a silicon oxide film formed using an organosilane material such as tetraethoxysilane (TEOS) is formed after an intermediate reaction product moves quickly on the surface of a base in a film formation; therefore, the bonding layer having a stacked structure can have a smooth surface.

Accordingly, the outermost layer of the bonding layer 12 is preferably formed with a silicon oxide film formed using an organosilane material because smoothness is improved.

The reason why the surface which is in contact with the single crystal semiconductor substrate 11 has an insulating property is because, when the surface which is in contact with the single crystal semiconductor substrate 11 has conductivity, a semiconductor surface and the conductive surface are in contact with each other, so that leakage of a transistor occurs.

Note that if the surface of the base substrate has smoothness and an insulating property, a bonding layer is not necessarily formed.

Figure 1C:
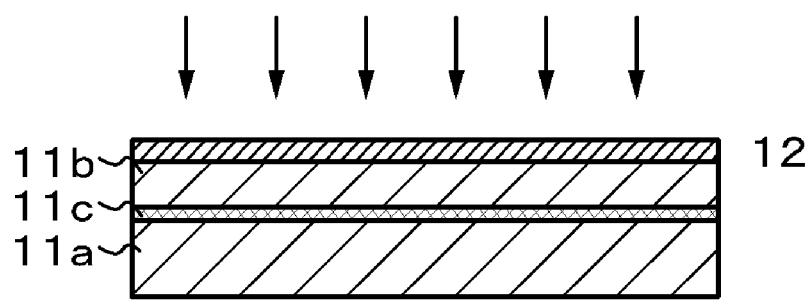

Next, a predetermined element is added to the single crystal semiconductor substrate 11 to form an embrittlement region 11c (also referred to as a microbubble layer, a separation layer, a peeling layer, and the like) between a first region 11a and a second region 11b (FIG. 1C).

Note that the embrittlement region may be formed before the bonding layer is formed.

Note that when the semiconductor layer is exposed in formation of the embrittlement region, the semiconductor layer becomes rough in ion implantation or doping.

Accordingly, when the embrittlement region is formed, it is preferable to form a protective film such as a silicon oxide film, a silicon nitride film, a silicon oxynitride film, or a silicon nitride oxide film.

Therefore, when the embrittlement region is formed after the bonding layer is formed, the bonding layer serves as a protective film.

On the other hand, when the embrittlement region is formed before the bonding layer is formed, it is preferable to form the embrittlement region after the protective film is formed.

Note that when the bonding layer is heated at higher than or equal to 400° C., a crack might occur in the single crystal semiconductor substrate in formation of the bonding layer; therefore, the embrittlement region is preferably formed after the bonding layer is formed.

In particular, thermal oxidation is usually performed at a temperature higher than or equal to 800° C.; therefore, when the embrittlement region is formed before the bonding layer is formed, it is inevitable that a crack occurs in the single crystal semiconductor substrate in formation of the bonding layer.

Thus, in particular, when the thermally oxidized film is used as the bonding layer, the embrittlement region is preferably formed after the bonding layer is formed.

As the predetermined element, hydrogen, helium, or the like can be used.

As a method for adding hydrogen, helium, or the like, an ion implantation method in which mass separation is performed, an ion doping method in which mass separation is not performed, or the like can be used.

Note that since an ion doping method is a method in which hydrogen, helium, or the like is added to the object to be irradiated and mass separation is not performed, impurities other than hydrogen, helium, or the like in a doping atmosphere are also added to the object to be irradiated.

That is, when hydrogen or the like is added to the object to be irradiated by an ion doping method, oxygen in the doping atmosphere is also added to the object to be irradiated; therefore, oxygen concentration in the object to be irradiated increases.

Accordingly, a method by which the outward diffusion of oxygen is encouraged is particularly effective in the sense that oxygen mixed by an ion doping method is removed.

Note that the single crystal semiconductor substrate itself includes oxygen to some extent. Therefore, even when an ion implantation method in which mass separation is performed is used, it is naturally meaningful to use a method which encourages the outward diffusion of oxygen (specifically, when a Czochralski method (Cz method) is used to form an ingot of single crystal silicon, it is inevitable that oxygen is mixed from a quartz crucible to the ingot).

Figure 2A:
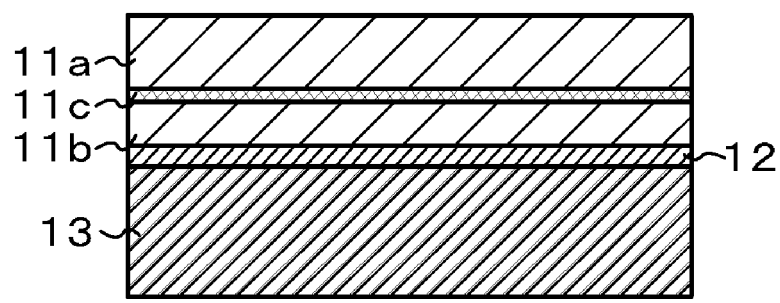
FIGS. 2A and 2B illustrate an example of a method for manufacturing an SOI substrate.
Figure 2B:
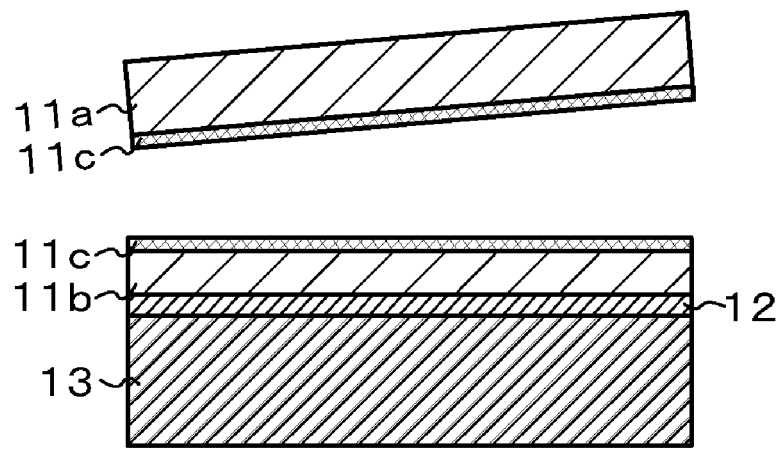

Next, the surface of the bonding layer 12 is bonded to a base substrate 13 and heating is performed (FIGS. 2A and 2B).

Note that before bonding, to strengthen bonding between two bonding surfaces, at least one of the two bonding surfaces is preferably subjected to surface treatment for being hydrophilic or activation.

As the surface treatment for being hydrophilic, surface treatment using ozone water, ammonium hydroxide/hydrogen peroxide mixture (a mixed solution of ammonia water and a hydrogen peroxide solution), or the like can be used.

As for the surface treatment for activation, surface treatment such as oxygen plasma treatment, nitrogen plasma treatment, or a noble gas plasma treatment (specifically, argon plasma treatment) can be used.

When the surface of the bonding layer 12 is bonded to the base substrate, the surface of the bonding layer and the surface of the base substrate have smoothness, whereby bonding is generated (FIG. 2A).

When heating is performed after bonding, the volume of microvoids formed in the embrittlement region is changed, thereby generating a crack in the embrittlement region, so that the first region 11a and the second region 11b can be separated from each other (FIG. 2B).

As the base substrate, a silicon wafer, a glass substrate, a quartz substrate, or a metal substrate (a stainless steel substrate or the like) can be used.

A heating temperature for generating a crack along the embrittlement region may be higher than or equal to 400° C.

Note that before heating for generating a crack along the embrittlement region, heating (higher than or equal to 200° C. and lower than 400° C.) may be performed or pressure may be applied to strengthen bonding. Heating may be performed and pressure may be applied.

The embrittlement region 11c which remains on the second region 11b side has a lot of defects because hydrogen, helium, or the like is added at high concentration.

Figure 3A:
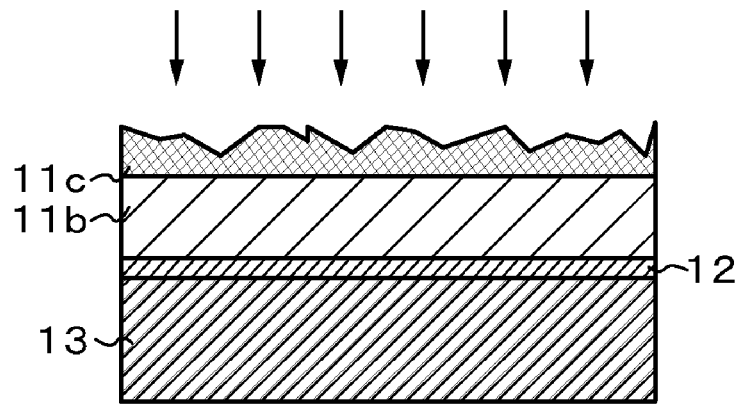
FIGS. 3A to 3C illustrate an example of a method for manufacturing an SOI substrate.

Therefore, after bonding, the surface of the second region 11b (the single crystal semiconductor layer) is preferably etched to remove the embrittlement region 11c (FIG. 3A).

As a method for etching, a method in which etching is performed without a resist mask being provided (etch back), a method in which a surface is polished by a chemical mechanical polishing (CMP) method or the like, or the like is preferably used.

Note that for reducing the number of steps, a step of removing the embrittlement region 11c may be omitted.

Note that since a crack is generated in the embrittlement region 11c to perform separation, the surface of the embrittlement region 11c has unevenness (FIG. 3A).

Figure 3B:
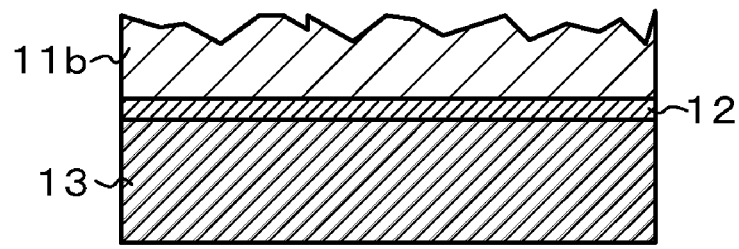

Then, when etch back is performed, a shape reflecting the unevenness on the surface of the embrittlement region 11c remains (FIG. 3B).

Therefore, irradiation is performed while a laser beam is scanned to melt the single crystal semiconductor layer, whereby smoothness of the surface can be improved.

Figure 3C:
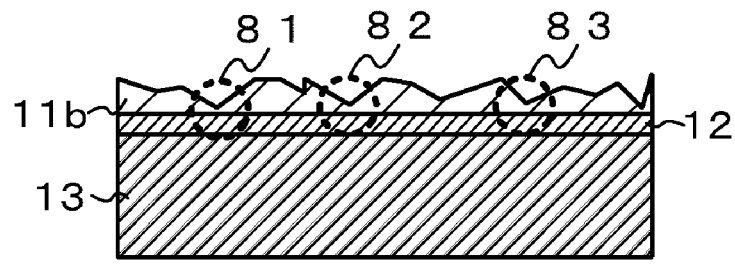

Note that when an average value of the thickness of the second region 11b (the single crystal semiconductor layer) after the etch back is less than 100 nm, the probability that a hole is generated in a portion of a valley on the surface increases after irradiation with a laser beam (see a dashed line 81, a dashed line 82, and a dashed line 83 in FIG. 3C).

The value of 100 nm is calculated in such a manner that samples in which an average value of the thickness of the second region 11b (the single crystal semiconductor layer) after the etch back is changed by 10 nm are prepared and these samples are irradiated with a laser beam to be observed by a microscope.

As a result of the microscope, in the sample in which the average value of the thickness of the second region 11b (the single crystal semiconductor layer) after the etch back is less than 100 nm, the number of holes sharply increases.

Note that the average value of the thickness is calculated in such a manner that a plurality of portions over the single crystal semiconductor layer is measured using an optical film thickness measurement system (product name: NanoSpec) and an average value of the measurement results of the plurality of portions is used.

Accordingly, it is preferable to perform addition of hydrogen, helium, or the like and etch back so that the average value of the thickness of the second region 11b (the single crystal semiconductor layer) after the etch back is greater than or equal to 100 nm.

Note that an acceleration voltage when hydrogen, helium, or the like is added is adjusted, whereby the position of the embrittlement region 11c can be adjusted. Therefore, the acceleration voltage when hydrogen, helium, or the like is added may be adjusted, so that the thickness before the etch back may be set.

Then, the thickness after the etch back can be adjusted if the second region 11b (the single crystal semiconductor layer) is etched to a desired thickness in consideration of an etching rate.

Next, a region irradiated with the laser beam 14 is scanned while being melted, and the outward diffusion of oxygen is performed (FIG. 4A).

The region irradiated with the laser beam may be a region in which at least a semiconductor element (a transistor or the like) is formed. The entire surface of the single crystal semiconductor layer may be irradiated with a laser beam.

As the types of the laser beam 14, any laser beam can be used as long as it has a wavelength which is absorbed by the single crystal semiconductor layer (for example, an excimer laser beam, a YAG laser beam, a $YVO_4$ laser beam, or the like)

The region irradiated with the laser beam 14 may have any shape (for example, a spot shape, a linear shape, a plane shape, or the like).

Note that the laser beam is not necessarily scanned as long as the region irradiated with the laser beam has a plane shape and a desired region can be melted at one time.

When irradiation is performed while a pulse laser beam is scanned, it is preferable to scan irradiation regions which partly overlap with each other in order to sufficiently heat the semiconductor layer (specifically, a pulse laser beam is preferably scanned so that one position is irradiated with the pulse laser beam 5 times to 50 times on average).

A step of performing the outward diffusion of oxygen may be performed at the same time as or separately from the step of improving the smoothness of the surface (a laser beam which is the same type as the laser beam 14 can be used in the case where the smoothness of the surface is improved by another step).

In FIG. 4A, the step of performing the outward diffusion of oxygen and the step of improving the smoothness of the surface are performed at the same time.

The portion irradiated with the laser beam 14 becomes a semiconductor 11d in a melted state.

The semiconductor 11d in a melted state has a higher diffusion coefficient of oxygen than a semiconductor in a solid-phase state, and temperature increases by the irradiation with the laser beam 14; therefore, the outward diffusion of oxygen is promoted (see a dashed line 80 in FIG. 4A).

Here, in the case where the bonding layer 12 is an insulating film including oxygen, when the semiconductor in a melted state is in contact with the insulating film including oxygen, there arises a problem in that oxygen in the insulating film including oxygen diffuses into the semiconductor in a melted state.

Thus, when the insulating film which is in contact with the single crystal semiconductor layer is an insulating film including oxygen, it is preferable to perform irradiation with a laser beam having energy density so that the bottom portion of the single crystal semiconductor layer is in a solid-phase state (see a dashed line 90 in FIG. 4A).

That is, it is preferable to partly melt the single crystal semiconductor layer by the irradiation with the laser beam.

Partly melting means that the bottom portion of the single crystal semiconductor layer is in a solid-phase state and a region over the bottom portion is in a melted state.

This is because the following reason: when the single crystal semiconductor layer is partly melted by the irradiation with a laser beam, a semiconductor in a solid-phase state with a lower diffusion coefficient of oxygen than a semiconductor in a melted state can be interposed between the semiconductor in a melted state and the insulating film including oxygen; as a result, oxygen in the insulating film including oxygen can be prevented from diffusing into the semiconductor in a melted state.

Note that the problem in that oxygen in a base diffuses into the semiconductor in a melted state also occurs in the case where the base substrate is a substrate including oxygen, such as a glass substrate or a quartz substrate, when the single crystal semiconductor layer is directly bonded to the base substrate.

Here, a method for determining energy density so that the bottom portion of a crystal semiconductor layer is in a solid-phase state will be described.

First, a plurality of samples each formed using an SOI substrate irradiated with a laser beam whose energy density is different depending on each sample in advance is prepared.

Next, a cross section of a semiconductor layer in each of the plurality of samples is observed by electron micrograph, the semiconductor layer is observed by SIMS (secondary ion mass spectrometry) analysis, or the like.

For example, when the cross section of the semiconductor layer is observed by electron micrograph, the depth of the semiconductor layer which is melted is judged from a crystal state of the semiconductor layer.

Since impurities (carbon, nitrogen, oxygen, or the like) are easily gathered at the boundary between the semiconductor layer in a melted state and the semiconductor layer in a solid-phase state, a peak position of impurity concentration can be judged as a boundary between the semiconductor layer in a melted state and the semiconductor layer in a solid-phase state if the SIMS analysis is performed.

Therefore, when the semiconductor layer is melted to a desired depth, a plurality of samples is formed and measured in advance, whereby appropriate energy density can be determined Needless to say, a method for determining energy density is not limited to the exemplified method.

In FIG. 4A, irradiation with a laser beam is performed without the base substrate 13 being heated; however, as illustrated in FIG. 4B, irradiation with a laser beam is preferably performed while the base substrate 13 is heated.

That is, when a laser beam is emitted while the base substrate is heated, the single crystal semiconductor layer is also heated.

Then, when the single crystal semiconductor layer is in a heated state, the cooling rate of the melted single crystal semiconductor layer is relaxed; therefore, the melting time of the single crystal semiconductor layer can be lengthened.

If the melting time of the single crystal semiconductor layer is lengthened, the time of retaining a melted state with a high diffusion coefficient of oxygen is lengthened; therefore, the outward diffusion of oxygen can be further promoted.

Accordingly, it is preferable to perform irradiation with a laser beam while the base substrate of the SOI substrate is heated because a promoting effect of the outward diffusion of oxygen due to the irradiation with a laser beam can be encouraged.

If the temperature of the base substrate is higher than or equal to 500° C., oxygen can be reduced further as compared with the case where the base substrate is not heated.

As the temperature of the base substrate is higher, the cooling rate of the semiconductor in a melted state can be slowed down; therefore, the temperature of the base substrate is preferably high.

In addition, if temperature is high even when the semiconductor layer is in a solid-phase state, the outward diffusion of oxygen occurs slightly; therefore, it can be said that the outward diffusion of oxygen is encouraged further (see the dashed line 80 in FIG. 4B).

Note that when the temperature of the base substrate is higher than or equal to a melting point of the base substrate, the base substrate is melted.

In addition, when the temperature of the base substrate is higher than or equal to a strain point of the base substrate, the base substrate is strained.

Therefore, the upper limit of the temperature range of the base substrate is preferably selected from the temperature lower than the melting point of the base substrate and the temperature lower than the strain point of the base substrate.

Note that when the single crystal semiconductor layer is formed using silicon, the melting point of silicon is about 1414° C.; therefore, even when the upper temperature limit (melting point, strain point, and the like) of the base substrate is higher than or equal to 1414° C., the temperature of the base substrate needs to be lower than 1414° C. (that is, the upper limit of the temperature range of the base substrate can be said to be less than the melting point of the single crystal semiconductor layer).

Note that the upper limit of the temperature range of the base substrate may be selected from lower than or equal to 600° C. (or lower than 600° C.), lower than or equal to 650°

C. (or lower than 650° C.), lower than or equal to 700° C. (or lower than 700° C.), lower than or equal to 750° C. (or lower than 750° C.), lower than or equal to 800° C. (or lower than 800° C.), lower than or equal to 850° C. (or lower than 850° C.), lower than or equal to 900° C. (or lower than 900° C.), lower than or equal to 950° C. (or lower than 950° C.), lower than or equal to 1000° C. (or lower than 1000° C.), lower than or equal to 1050° C. (or lower than 1050° C.), lower than or equal to 1100° C. (or lower than 1100° C.), lower than or equal to 1150° C. (or lower than 1150° C.), lower than or equal to 1200° C. (or lower than 1200° C.), lower than or equal to 1250° C. (or lower than 1250° C.), lower than or equal to 1300° C. (or lower than 1300° C.), lower than or equal to 1350° C. (or lower than 1350° C.), and lower than or equal to 1400° C. (or lower than 1400° C.). Note that lower than X° C. means a temperature lower than X° C. (X is a given number).

In addition, the lower limit of the temperature range of the base substrate may be selected from higher than or equal to 500° C. (or higher than 500° C.), higher than or equal to 550° C. (or higher than 550° C.), higher than or equal to 600° C. (or higher than 600° C.), higher than or equal to 650° C. (or higher than 650° C.), higher than or equal to 700° C. (or higher than 700° C.), higher than or equal to 750° C. (or higher than 750° C.), higher than or equal to 800° C. (or higher than 800° C.), higher than or equal to 850° C. (or higher than 850° C.), higher than or equal to 900° C. (or higher than 900° C.), higher than or equal to 950° C. (or higher than 950° C.), higher than or equal to 1000° C. (or higher than 1000° C.), higher than or equal to 1050° C. (or higher than 1050° C.), higher than or equal to 1100° C. (or higher than 1100° C.), higher than or equal to 1150° C. (or higher than 1150° C.), higher than or equal to 1200° C. (or higher than 1200° C.), higher than or equal to 1250° C. (or higher than 1250° C.), higher than or equal to 1300° C. (or higher than 1300° C.), and higher than or equal to 1350° C. (or higher than 1350° C.). Note that higher than X° C. means a temperature higher than X° C. (X is a given number).

Note that the upper limit of the temperature range of the base substrate is larger than the lower limit of the temperature range of the base substrate.

As a heating method of the base substrate, there are methods such as contact heating, heating by light irradiation, and induction heating.

The contact heating is a method which heats a stage or the like on which a substrate is placed and heats the substrate that is in contact with the stage or the like.

Accordingly, if the contact heating is used, heating can be performed even when any type of a base substrate is used.

On the other hand, the heating with light irradiation is a method in which a substrate is irradiated with light having a wavelength that is absorbed by the substrate to generate heat from the substrate.

Accordingly, when the heating with light irradiation is used, the type of a base substrate and a wavelength of light are necessarily selected.

As an example of the heating by light irradiation, there are a method in which a base substrate includes silicon as its main component and light (a laser beam, lamp light (such as a tungsten halogen lamp), or the like) is absorbed by silicon, and the like.

As a laser beam (referred to as a second laser beam), a laser beam similar to the laser beam 14 (a first laser beam) for diffusing oxygen can be used. For example, the second laser beam with energy density with which the base substrate is not melted is emitted from the base substrate side.

In this case, the first laser beam is emitted from the single crystal semiconductor layer side and the second laser beam is emitted from the base substrate side, while part of the region irradiated with the first laser beam overlaps with part of a region irradiated with the second laser beam. Note that if the wavelength of the first laser beam is different from the wavelength of the second laser beam, treatment can be performed even when the second laser beam is emitted from the single crystal semiconductor layer side.

In addition, scanning is performed so that the scanning direction of the first laser beam is the same as the scanning direction of the second laser beam.

Further, the second laser beam is used for remaining heat; therefore, the region irradiated with the second laser beam is preferably larger than the region irradiated with the first laser beam.

When the region irradiated with the second laser beam is larger than the region irradiated with the first laser beam, the area of the remaining heat can be expanded to a wide range. Accordingly, a region where a melted state can be retained can be expanded to a wide range.

The base substrate, which is very thick compared with the single crystal semiconductor layer, is irradiated with the second laser beam.

Accordingly, a laser beam having a longer wavelength than the first laser beam is preferably used for the second laser beam.

If a wavelength of the laser beam is longer, the object to be irradiated is irradiated with the laser beam from the surface of the object to be irradiated to a deeper position.

The induction heating is a method in which a conductor is provided in an alternating current magnetic field and an eddy current is generated in the conductor to generate heat from the substrate.

Therefore, the base substrate in which the induction heating can be performed is preferably a conductor in which an eddy current easily flows.

A conductor in which an eddy current easily flows is a conductor which has high resistance to some extent; therefore, when the induction heating is used, it is preferable to use a silicon wafer, an iron substrate, a stainless steel substrate, or the like as the base substrate.

Since the base substrate takes time to reach a desired temperature by the contact heating, processing time can be shortened using the heating by light irradiation, the induction heating, or the like in which the base substrate takes a short time to reach a desired temperature. Note that a heating method in which a conductor is heated by induction heating and heat conduction from the conductor is utilized may be used.

Note that an irradiation atmosphere of a laser beam is preferably set to an inert gas atmosphere (nitrogen, a noble gas, or the like) because oxygen from the atmosphere can be prevented from entering.

Further, an irradiation atmosphere of a laser beam is preferably set to a reduced-pressure atmosphere (an atmosphere in which air pressure is less than or equal to $10^{-3}$ Pa) because the entry of oxygen from the atmosphere can be prevented.

In addition, an irradiation atmosphere of a laser beam is preferably set to a reducing atmosphere (an atmosphere including hydrogen, an atmosphere including carbon monoxide, an atmosphere including hydrogen iodide, or the like (only a reducing gas or a mixed gas of a reducing gas and an inert gas may be used)) because a reduction reaction occurs, so that the outward diffusion of oxygen can be encouraged.

That is, it is preferable to include a reducing gas in an irradiation atmosphere of a laser beam.

In particular, an atmosphere including hydrogen iodide is preferable because it has a reduction action, and at the same time, iodine which is a halogen can remove contamination of heavy metal or the like.

Further, a reduced-pressure atmosphere and an inert gas atmosphere are preferably used or a reduced-pressure atmosphere and a reducing atmosphere are preferably used because an effect of reducing oxygen is increased.

Note that a native oxide film of the semiconductor layer is preferably removed using a hydrogen fluoride aqueous solution before irradiation with a laser beam.

The native oxide film is unevenly formed; therefore, when the native oxide film exists, a crystal state of the semiconductor film after irradiation with a laser beam has unevenness. In addition, oxygen from the native oxide film can be prevented from diffusing into the semiconductor layer.

On the other hand, in order to reduce the number of steps, hydrogen fluoride may be included in an atmosphere, such as a reduced-pressure atmosphere, a reducing atmosphere, or an atmosphere of reduced-pressure atmosphere and a reducing atmosphere, instead of using a hydrogen fluoride aqueous solution.

Alternatively, hydrogen fluoride may be added to an air atmosphere or an inert gas atmosphere (rare gas, nitrogen, or the like).

Needless to say, only an atmosphere including hydrogen fluoride may be used.

That is, it is preferable that an irradiation atmosphere of a laser beam include a hydrogen fluoride gas.

Hydrogen fluoride is preferable because it has a function of removing a silicon oxide film; therefore, irradiation with a laser beam can be performed while a native oxide film on the surface of the semiconductor layer is removed.

In particular, a laser beam is preferably emitted in succession just after the SOI substrate is exposed to an atmosphere including hydrogen fluoride for a while because irradiation with a laser beam can be performed after a native oxide film is surely removed (the number of steps can be reduced because a laser beam is emitted in succession).

Note that hydrogen iodide, hydrogen fluoride, and the like easily erode metal; therefore, when hydrogen iodide, hydrogen fluoride, or the like is introduced to an atmosphere, it is preferable to coat an inner wall, a stage, or the like in a chamber where irradiation with a laser beam is performed with sapphire, diamond-like carbon, or the like.

In addition, the temperature of an irradiation atmosphere of a laser beam is preferably increased because the time of retaining a melted state is lengthened.

In consideration of the fact that there is an effect of reducing oxygen at the heating temperature of the base substrate higher than or equal to 500° C., it is preferable that the temperature of the irradiation atmosphere of the laser beam be higher than or equal to 500° C.

Note that the upper limit of the temperature range of the irradiation atmosphere of the laser beam may be selected from lower than or equal to 600° C. (or lower than 600° C.), lower than or equal to 650° C. (or lower than 650° C.), lower than or equal to 700° C. (or lower than 700° C.), lower than or equal to 750° C. (or lower than 750° C.), lower than or equal to 800° C. (or lower than 800° C.), lower than or equal to 850° C. (or lower than 850° C.), lower than or equal to 900° C. (or lower than 900° C.), lower than or equal to 950° C. (or lower than 950° C.), lower than or equal to 1000° C. (or lower than 1000° C.), lower than or equal to 1050° C. (or lower than 1050° C.), lower than or equal to 1100° C. (or lower than 1100° C.), lower than or equal to 1150° C. (or lower than 1150° C.), lower than or equal to 1200° C. (or lower than 1200° C.), lower than or equal to 1250° C. (or lower than 1250° C.), lower than or equal to 1300° C. (or lower than 1300° C.), lower than or equal to 1350° C. (or lower than 1350° C.), and lower than or equal to 1400° C. (or lower than 1400° C.). Note that lower than X° C. means a temperature lower than X° C. (X is a given number).

In addition, the lower limit of the temperature range of the irradiation atmosphere of the laser beam may be selected from higher than or equal to 500° C. (or higher than 500° C.), higher than or equal to 550° C. (or higher than 550° C.), higher than or equal to 600° C. (or higher than 600° C.), higher than or equal to 650° C. (or higher than 650° C.), higher than or equal to 700° C. (or higher than 700° C.), higher than or equal to 750° C. (or higher than 750° C.), higher than or equal to 800° C. (or higher than 800° C.), higher than or equal to 850° C. (or higher than 850° C.), higher than or equal to 900° C. (or higher than 900° C.), higher than or equal to 950° C. (or higher than 950° C.), higher than or equal to 1000° C. (or higher than 1000° C.), higher than or equal to 1050° C. (or higher than 1050° C.), higher than or equal to 1100° C. (or higher than 1100° C.), higher than or equal to 1150° C. (or higher than 1150° C.), higher than or equal to 1200° C. (or higher than 1200° C.), higher than or equal to 1250° C. (or higher than 1250° C.), higher than or equal to 1300° C. (or higher than 1300° C.), and higher than or equal to 1350° C. (or higher than 1350° C.). Note that higher than X° C. means a temperature higher than X° C. (X is a given number).

Note that the upper limit of the temperature range in the irradiation atmosphere of the laser beam is larger than the lower limit of the temperature range of the irradiation atmosphere of the laser beam.

As described above, an SOI substrate in which oxygen is reduced can be formed.

Note that in order to avoid generation of holes, it is preferable to perform irradiation with a laser beam in a state that an average value of the thickness of the single crystal semiconductor layers is greater than or equal to 100 nm.

However, in accordance with the scaling law, it is known that as the thickness of the single crystal semiconductor layer is smaller, characteristics of a transistor are improved.

Figure 5A:
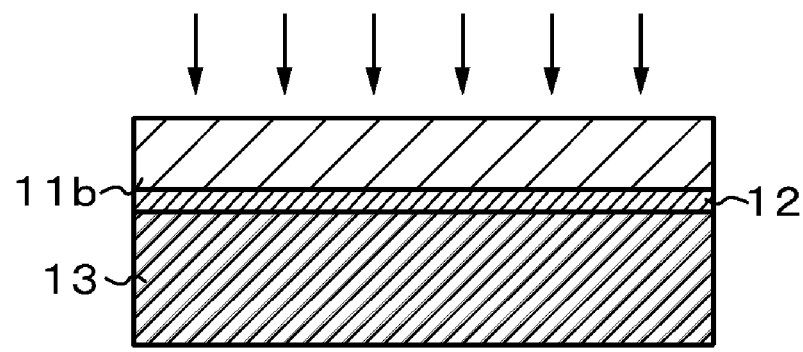
FIGS. 5A and 5B illustrate an example of a method for manufacturing an SOI substrate.
Figure 5B:
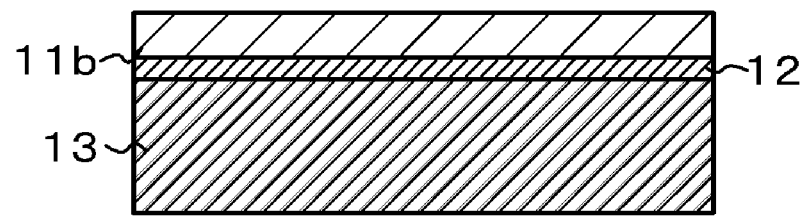

Accordingly, when the thickness of the single crystal semiconductor layer is smaller than 100 nm, it is preferable that the single crystal semiconductor layer having a thickness of greater than or equal to 100 nm be irradiated with a laser beam and etching for thin film be performed for reducing the thickness to less than 100 nm after the irradiation with a laser beam (FIGS. 5A and 5B).

Note that when the thickness of the single crystal semiconductor layer at the time of irradiation with a laser beam is larger than 300 nm, the laser beam is not sufficiently absorbed in some cases. Therefore, it is preferable that the thickness of the single crystal semiconductor layer at the time of irradiation with a laser beam be less than or equal to 300 nm.

This embodiment can be combined with any of the other embodiments.

(Embodiment 2)

In this embodiment, an example of a method for manufacturing a semiconductor device manufactured using an SOI substrate will be described.

Figure 6A:
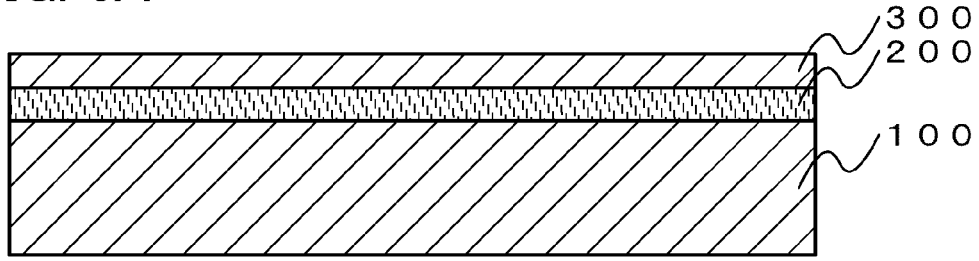
FIGS. 6A to 6C illustrate an example of a method for manufacturing a semiconductor device.

First, an SOI substrate having a base substrate 100, a bonding layer 200 provided over the base substrate 100, and a single crystal semiconductor layer 300 provided over the bonding layer 200 is prepared (FIG. 6A).

For the base substrate, the bonding layer, and the single crystal semiconductor layer, materials similar to those described in Embodiment 1 can be used.

Next, the single crystal semiconductor layer 300 is etched to have an island shape.

Here, an island-shaped semiconductor layer 301, an island-shaped semiconductor layer 302, and the like are formed (element separation step).

Figure 6B:
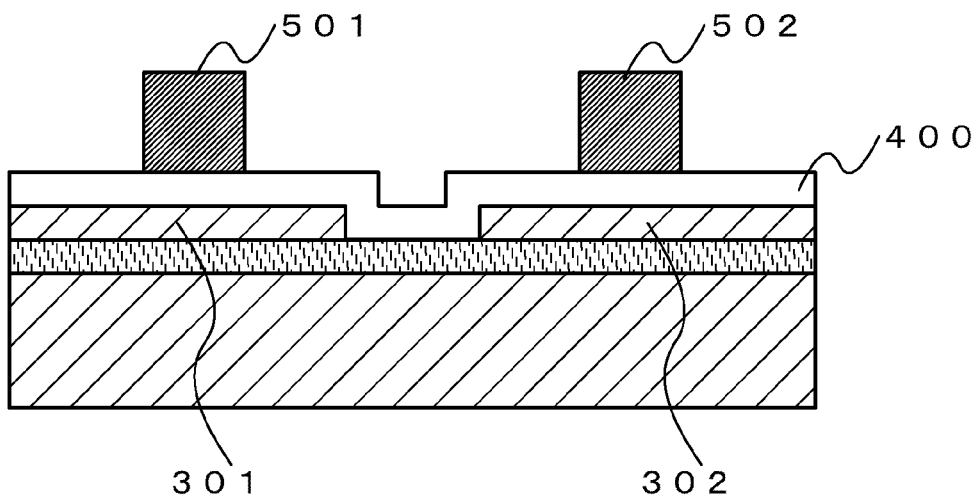

Then, a gate insulating film 400 is formed over the island-shaped semiconductor layer 301 and the island-shaped semiconductor layer 302, and then a gate electrode 501 and a gate electrode 502 are formed thereover (FIG. 6B).

The gate insulating film can be formed using a thermally oxidized film, a silicon oxide film, a silicon nitride film, a silicon nitride oxide film, a silicon oxynitride film, a hafnium compound film, or the like.

The gate insulating film may have a single-layer structure or a stacked structure.

The gate electrodes can be formed using tungsten, molybdenum, aluminum, titanium, silicon, or the like.

The gate electrodes may have a single-layer structure or a stacked structure.

Figure 6C:
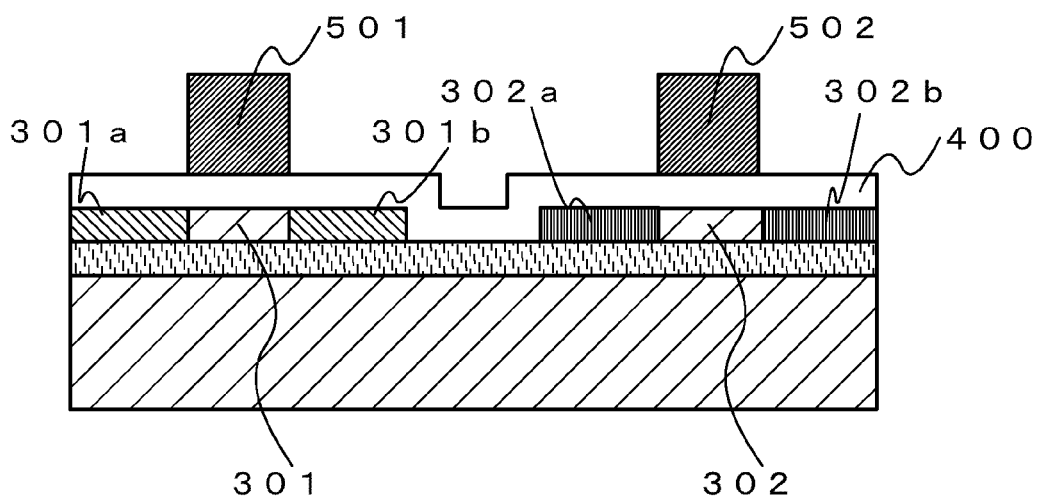

Next, a first impurity element is selectively added to the island-shaped semiconductor layer 301 to form an impurity region 301*a* and an impurity region 301*b* (FIG. 6C).

In addition, a second impurity element is selectively added to the island-shaped semiconductor layer 302 to form an impurity region 302*a* and an impurity region 302*b* (FIG. 6C).

The sequence of addition of the first impurity element and the second impurity element may be altered.

In addition, the first impurity element is one of a donor element (phosphorus, arsenic, or the like) or an acceptor element (boron or the like).

Further, the second impurity element is the other of the donor element (phosphorus, arsenic, or the like) or the acceptor element (boron or the like).

Note that an LDD region may be formed using a mask, a sidewall, or the like in the impurity region 301*a*, the impurity region 301*b*, the impurity region 302*a*, and the impurity region 302*b*.

Figure 7A:
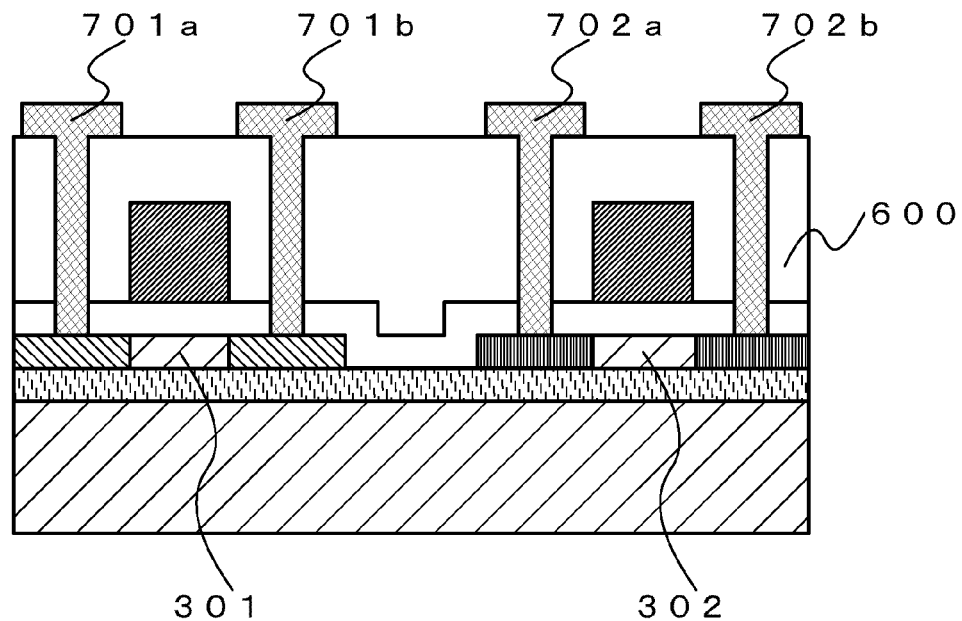
FIGS. 7A and 7B illustrate an example of a method for manufacturing a semiconductor device.
Figure 7B:
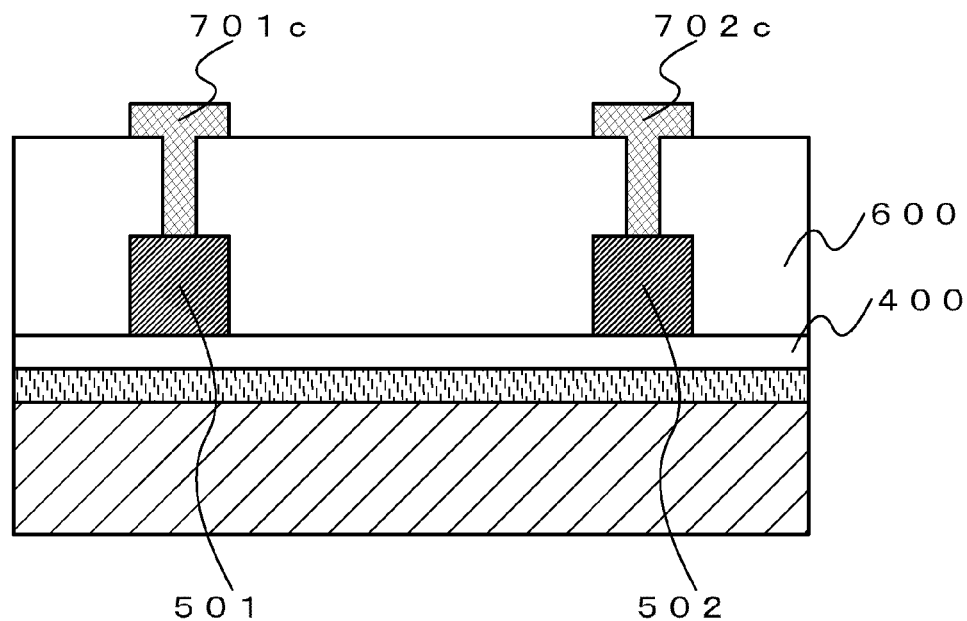

Next, an interlayer insulating film 600 is formed over the gate electrodes, contact holes are formed in the interlayer insulating film 600, and wirings 701*a*, 701*b*, 701*c*, 702*a*, 702*b*, and 702*c* which are electrically connected to the semiconductor layers and the gate electrodes are formed over the interlayer insulating film 600 through the contact holes (FIGS. 7A and 7B).

Note that FIGS. 7A and 7B are cross-sectional views illustrating different portions.

Then, contact portions between the gate electrodes and the wirings are portions in which the semiconductor layer is not provided under the gate electrodes (FIG. 7B).

The interlayer insulating film can be formed using a silicon oxide film, a silicon nitride film, a silicon oxide film including nitrogen, a silicon nitride film including oxygen, polyimide, acrylic, siloxane polymer, or the like.

The interlayer insulating film may have a single-layer structure or a stacked structure.

The wirings can be formed using metal such as aluminum, titanium, molybdenum, tungsten, gold, silver, or copper; or a transparent conductive material such as indium tin oxide (ITO).

The wirings may have a single-layer structure or a stacked structure.

This embodiment can be combined with any of the other embodiments.

(Embodiment 3)

In this embodiment, an example of a method for manufacturing a semiconductor device manufactured using an SOI substrate will be described.

Figure 8A:
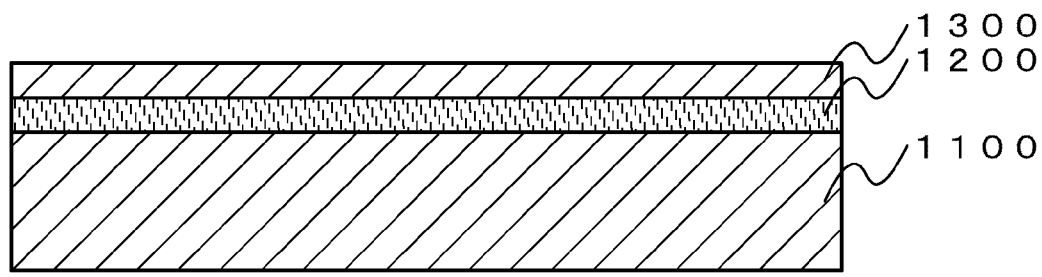
FIGS. 8A to 8C illustrate an example of a method for manufacturing a semiconductor device.

First, an SOI substrate having a base substrate 1100, a bonding layer 1200 provided over the base substrate 1100, and a single crystal semiconductor layer 1300 provided over the bonding layer 1200 is prepared (FIG. 8A).

For the base substrate, the bonding layer, and the single crystal semiconductor layer, materials similar to those described in Embodiment 1 can be used.

Figure 8B:
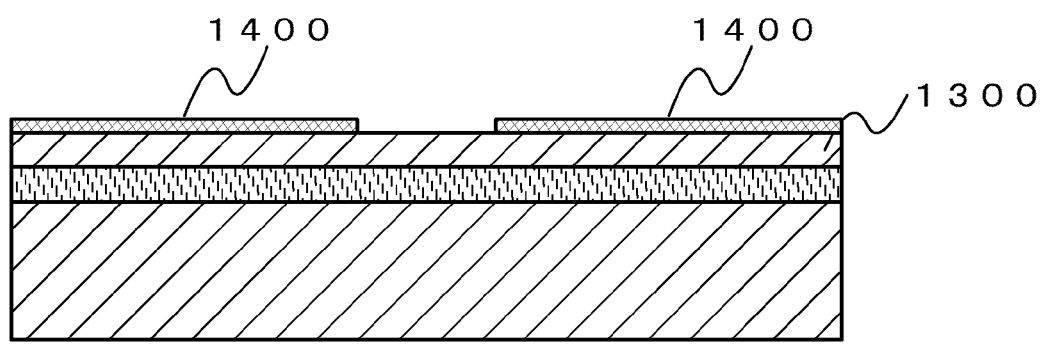

Next, island-shaped mask insulating films 1400 are formed over the single crystal semiconductor layer 1300 (FIG. 8B).

Figure 8C:
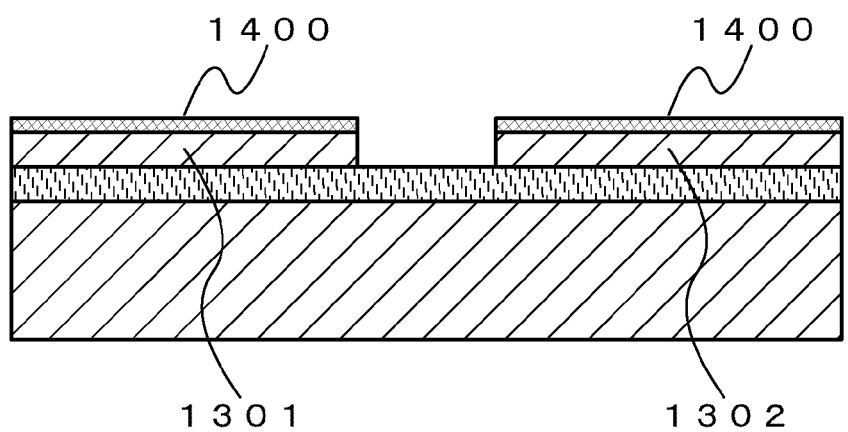

Then, the single crystal semiconductor layer 1300 is etched into an island shape using the mask insulating films 1400 as a mask (an island-shaped semiconductor layer 1301, an island-shaped semiconductor layer 1302, and the like are formed) (FIG. 8C, an element separation step).

Figure 9A:
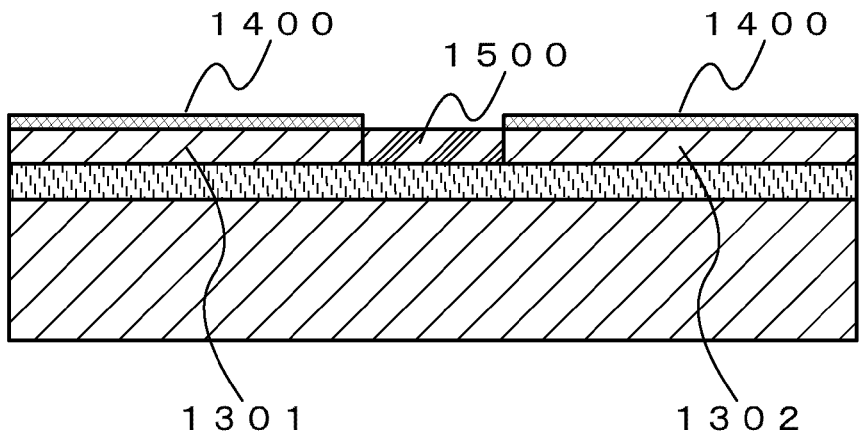
FIGS. 9A to 9C illustrate an example of a method for manufacturing a semiconductor device.

Next, an insulating film is formed over the mask insulating films 1400, and the insulating film is etched back or polished to form an embedded insulating film 1500 which fills a space between the island-shaped semiconductor layers (FIG. 9A).

Here, the mask insulating films 1400 and the embedded insulating film 1500 can be each formed using a silicon oxide film, a silicon nitride film, a silicon nitride oxide film, a silicon oxynitride film, or the like.

Note that a material of the mask insulating films 1400 is preferably different from a material of the embedded insulating film 1500 so that the mask insulating films 1400 are used as etching stoppers when the embedded insulating film 1500 is formed.

Figure 9B:
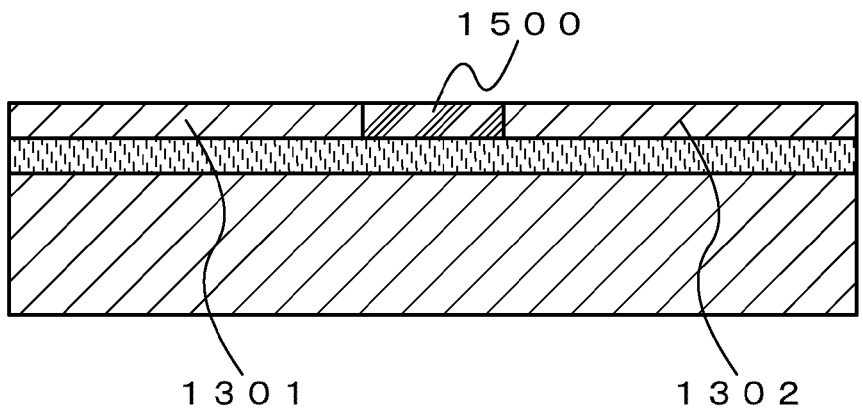

Next, the mask insulating films 1400 are removed (FIG. 9B).

Figure 9C:
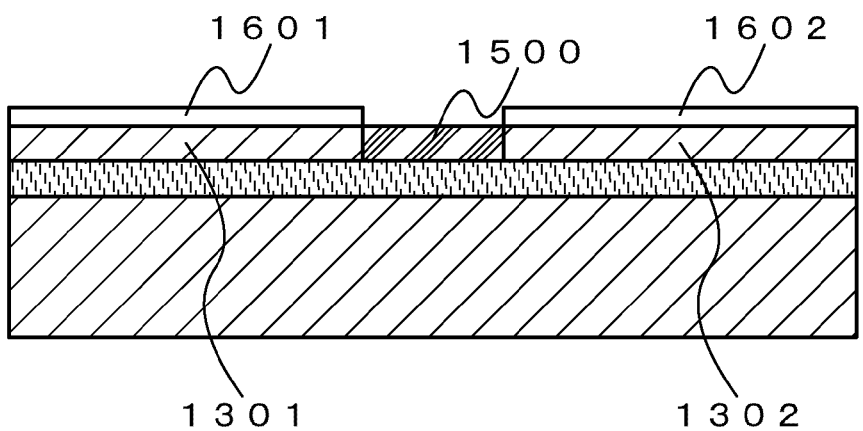

Then, a gate insulating film 1601 is formed over the island-shaped semiconductor layer 1301, and a gate insulating film 1602 is formed over the island-shaped semiconductor layer 1302 (FIG. 9C).

The gate insulating films can be formed using a thermally oxidized film, a silicon oxide film, a silicon nitride film, a silicon nitride oxide film, a silicon oxynitride film, a hafnium compound film, or the like.

The gate insulating films may each have a single-layer structure or a stacked structure.

Figure 10A:
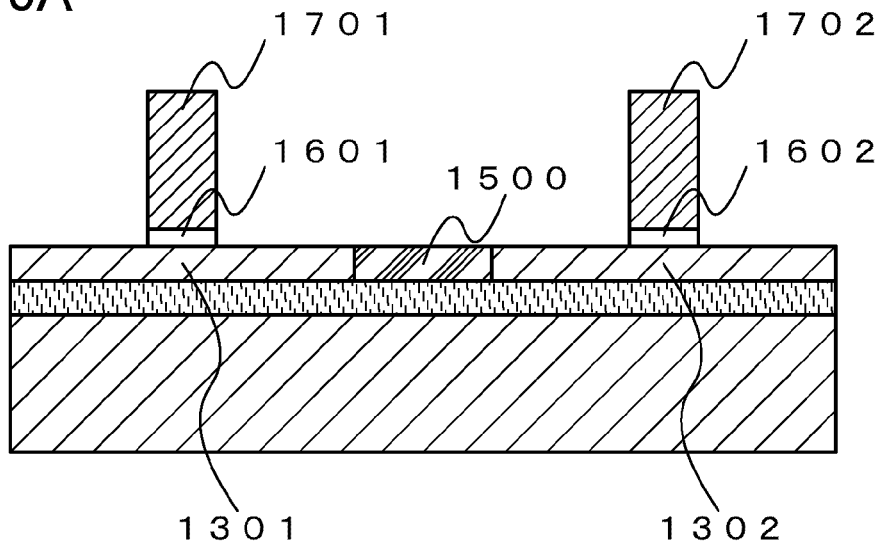
FIGS. 10A to 10C illustrate an example of a method for manufacturing a semiconductor device.

Next, a gate electrode 1701 including silicon as its main component and a gate electrode 1702 including silicon as its main component are formed over the gate insulating films (FIG. 10A).

It is preferable that a donor element or an acceptor element be added to the gate electrodes including silicon as its main component so as to reduce a resistance value.

Note that when the gate electrodes are formed as illustrated in FIG. 10A, the gate insulating films are also etched at the same time to form the gate insulating film 1601 and the gate insulating film 1602.

Further, the gate electrodes are formed at a position which overlaps with the island-shaped semiconductor layers and a position which overlaps with the embedded insulating film.

On the other hand, the embedded insulating film 1500 is formed so as to have approximately the same thickness as the island-shaped semiconductor layer.

Accordingly, by the provision of the embedded insulating film, steps at edges of the island-shaped semiconductor layers are reduced. Therefore, the gate electrodes and the island-shaped semiconductor layers can be prevented from short circuit due to disconnection generated in the gate insulating film caused by the steps at the edges of the island-shaped semiconductor layers.

Figure 15:
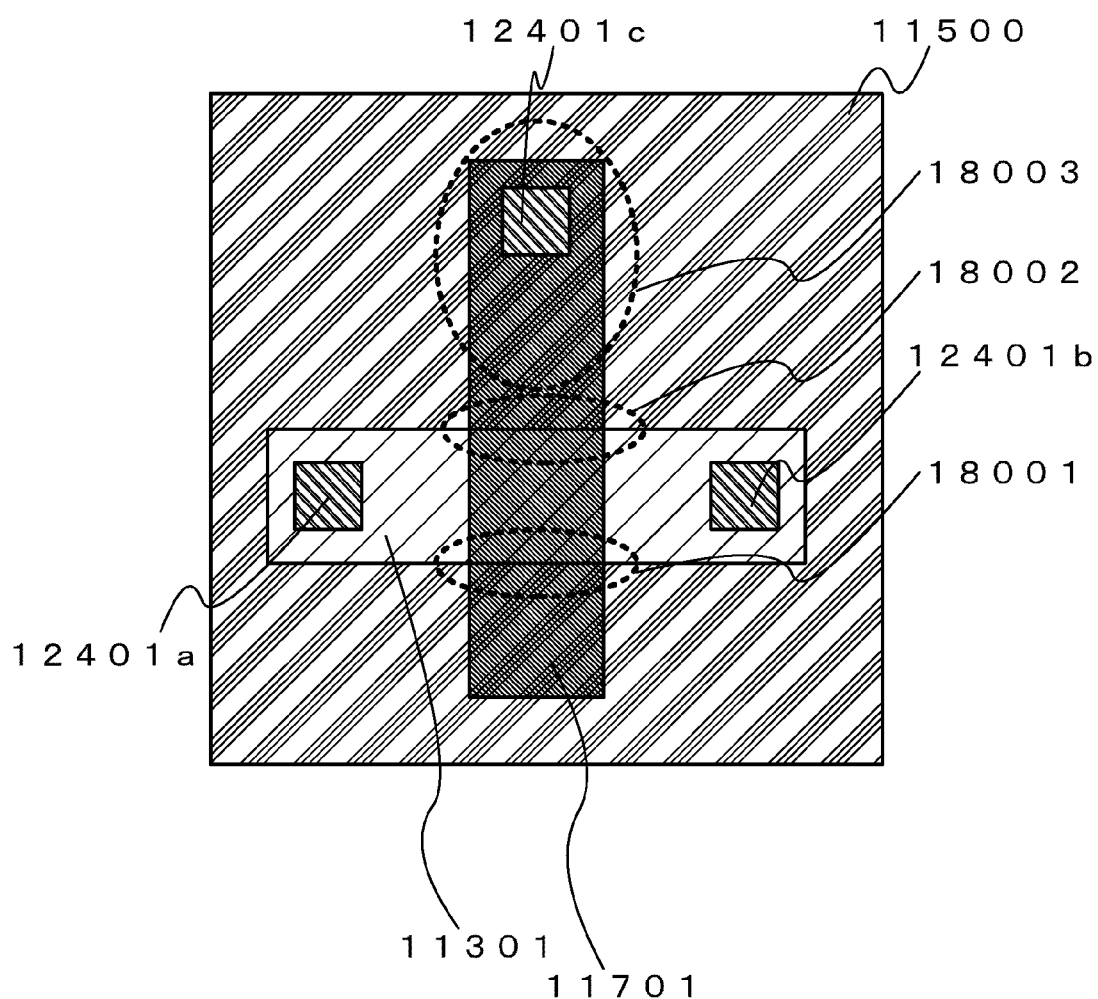
FIG. 15 illustrates an example of a top view of a semiconductor device.

Note that the edges of the island-shaped semiconductor layers are portions shown by a dashed line 18001 and a dashed line 18002 in FIG. 15.

FIG. 15 illustrates an island-shaped semiconductor layer 11301, an embedded insulating film 11500 formed around the island-shaped semiconductor layer 11301, a gate electrode 11701 placed at a position where part of the island-shaped semiconductor layer 11301 overlaps with part of the embedded insulating film 11500, contact regions 12401a and 12401b of the island-shaped semiconductor layer 11301 and a wiring, and a contact region 12401c of the gate electrode and a wiring.

Figure 10B:
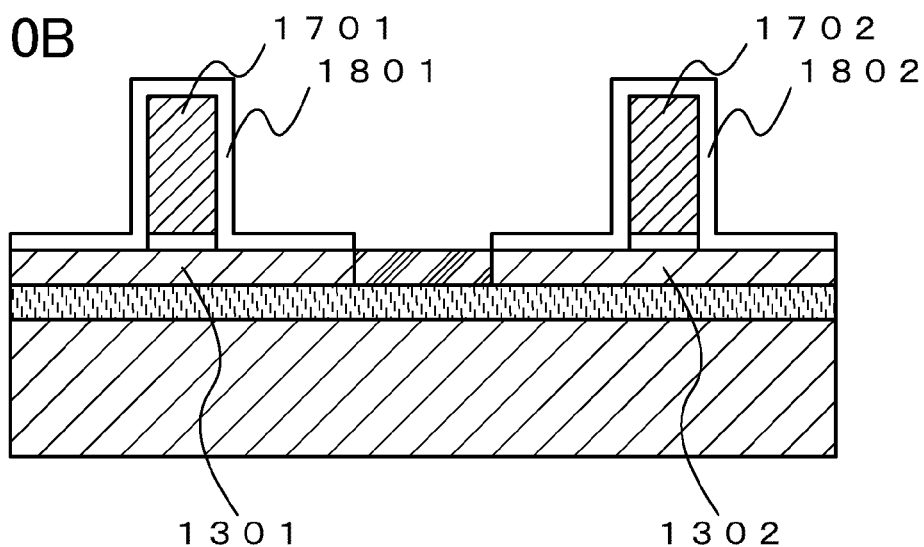

Next, the gate electrode 1701, the gate electrode 1702, the island-shaped semiconductor layer 1301, and the island-shaped semiconductor layer 1302 are oxidized to form an oxide film 1801 and an oxide film 1802 (FIG. 10B).

Note that instead of the oxide films, nitride films may be formed, or insulating films which are subjected to oxidation and nitridation at the same time may be formed.

Figure 10C:
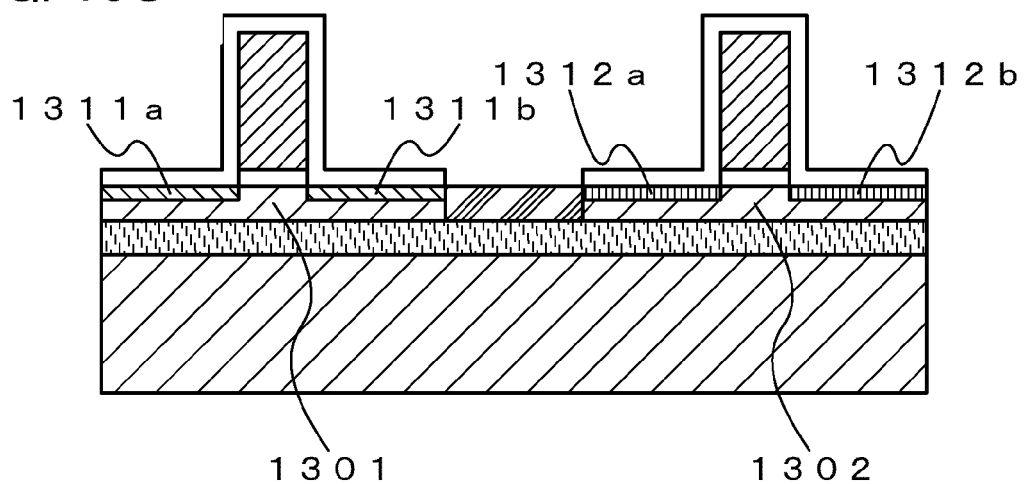

Next, an acceptor element (boron) is selectively added to the island-shaped semiconductor layer 1301 at a shallow portion to form a low-concentration impurity region 1311a and a low-concentration impurity region 1311b (FIG. 10C).

In addition, a donor element (arsenic) is selectively added to the island-shaped semiconductor layer 1302 at a shallow portion to form a low-concentration impurity region 1312a and a low-concentration impurity region 1312b (FIG. 10C).

Here, the reason why not phosphorus but arsenic is added is because arsenic is an element having a low diffusion coefficient used to suppress thermal diffusion in activation treatment.

If thermal diffusion is not concerned, phosphorus may be used.

Note that the addition of the donor element and the acceptor element may occur in reverse order.

Figure 11A:
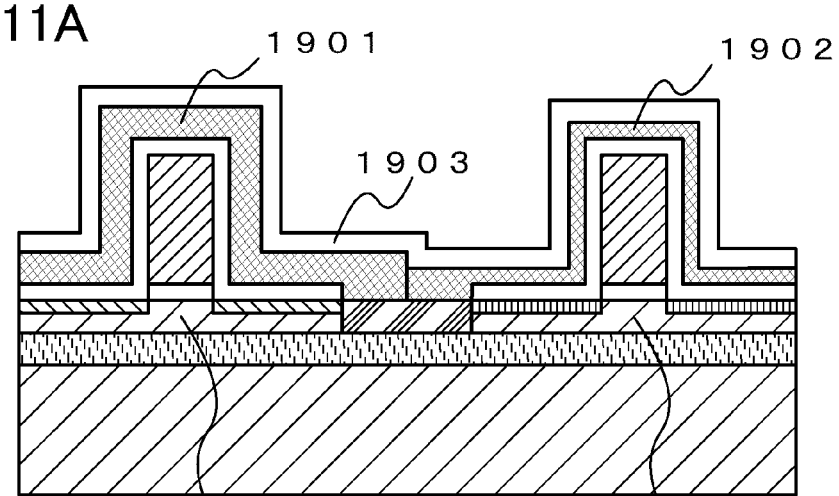
FIGS. 11A to 11C illustrate an example of a method for manufacturing a semiconductor device.

Next, an insulating film 1901 for forming sidewalls and an insulating film 1902 for forming sidewalls are formed, and an insulating film 1903 for forming sidewalls is formed over the insulating film 1901 and the insulating film 1902 (FIG. 11A). The insulating film 1901 covers the gate electrode 1701, and the insulating film 1902 covers the gate electrode 1702.

Figure 11B:
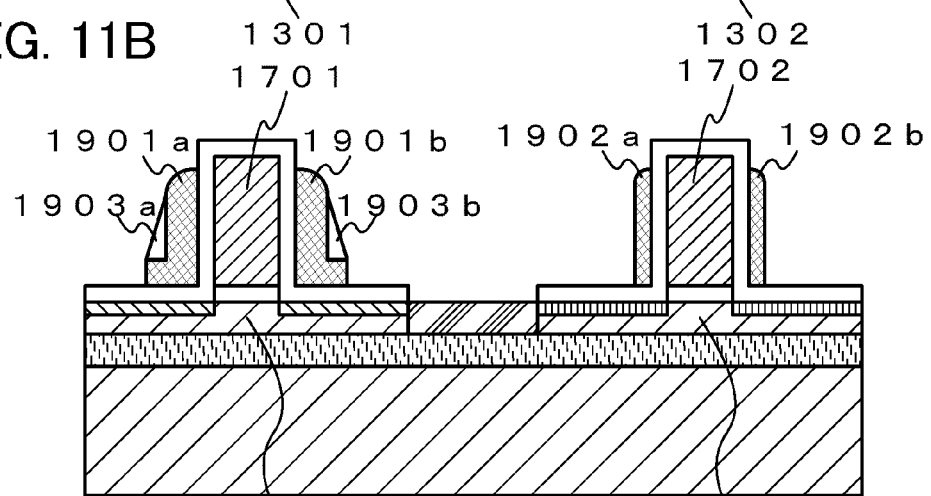

Next, the insulating films for forming sidewalls are etched back to form sidewalls 1901a, 1901b, 1902a, 1902b, 1903a, and 1903b (FIG. 11B).

Note that the insulating film 1901 for forming sidewalls is etched to form the sidewalls 1901a and 1901b. The insulating film 1902 for forming sidewalls is etched to form the sidewalls 1902a and 1902b. The insulating film 1903 for forming sidewalls is etched to form the sidewalls 1903a and 1903b.

The insulating films for forming sidewall can be each formed using a silicon oxide film, a silicon nitride film, a silicon nitride oxide film, a silicon oxynitride film, or the like.

Note that the thickness of the insulating film 1901 for forming sidewalls is set to be larger than the thickness of the insulating film 1902 for forming sidewalls so that each width of the sidewalls formed on the side walls of the gate electrode 1701 is larger than each width of the sidewalls formed on the side walls of the gate electrode 1702.

Further, a material of the insulating film 1903 for forming sidewalls is different from a material of the insulating film 1901 for forming sidewalls so that the sidewalls formed on the side walls of the gate electrode 1701 each have an L-shape cross section.

When the thickness of the insulating film 1901 for forming sidewalls is larger than the thickness of the insulating film 1902 for forming sidewalls and the material of the insulating film 1903 for forming sidewalls is different from the material of the insulating film 1901 for forming sidewalls, the insulating film 1903 for forming sidewalls serves as a mask. Therefore, each sidewall formed on the side walls of the gate electrode 1701 can have an L-shape cross section and the width of each sidewall can be increased.

That is, when the thickness of the insulating film 1901 for forming sidewalls is larger than the thickness of the insulating film 1902 for forming sidewalls and the material of the insulating film 1903 for forming sidewalls is different from the material of the insulating film 1901 for forming sidewalls, sidewalls having different widths can be formed in the same etch back step.

Figure 11C:
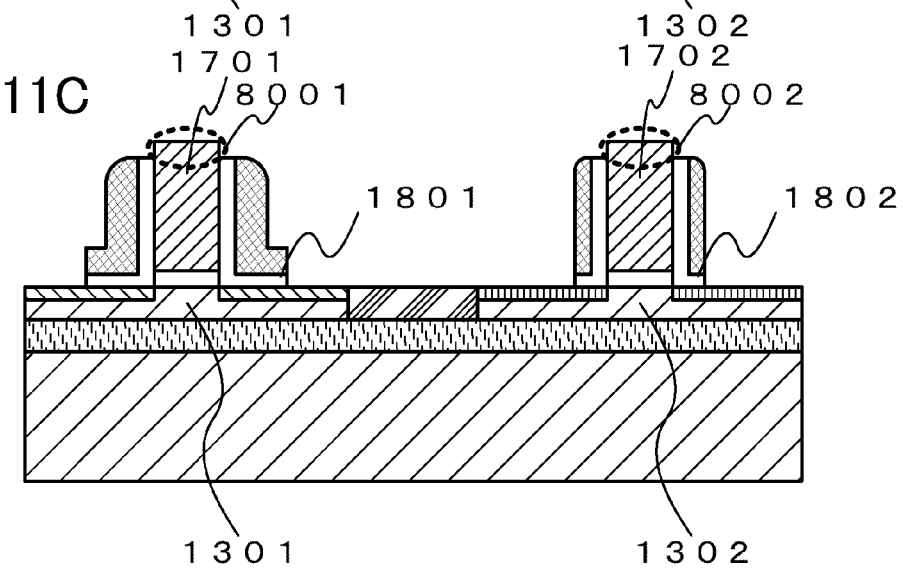

Next, an exposed part of the oxide film 1801 and an exposed part of the oxide film 1802 are removed (FIG. 11C).

Note that the etch back when the sidewalls are formed is performed under the condition such that tops of the gate electrodes are projected when the oxide film 1801 and the oxide film 1802 which are exposed are removed (see a dashed line 8001 and a dashed line 8002 in FIG. 11C).

The tops of the gate electrodes are projected and part of the side walls of the gate electrodes is exposed; therefore, silicidation of the gate electrodes can be promoted in a silicidation step later.

Specifically, since the tops of the gate electrodes are projected, an area which is in contact with a metal film can be increased, silicidation can be promoted, and the thickness of silicide regions can be increased.

Note that since contact portions of the gate electrodes are formed at a position which is away from a position that overlaps with the island-shaped semiconductor layers as shown by a dashed line 18003 in FIG. 15, it is preferable to increase the thickness of the silicide regions and decrease the resistance of the gate electrodes.

Figure 12A:
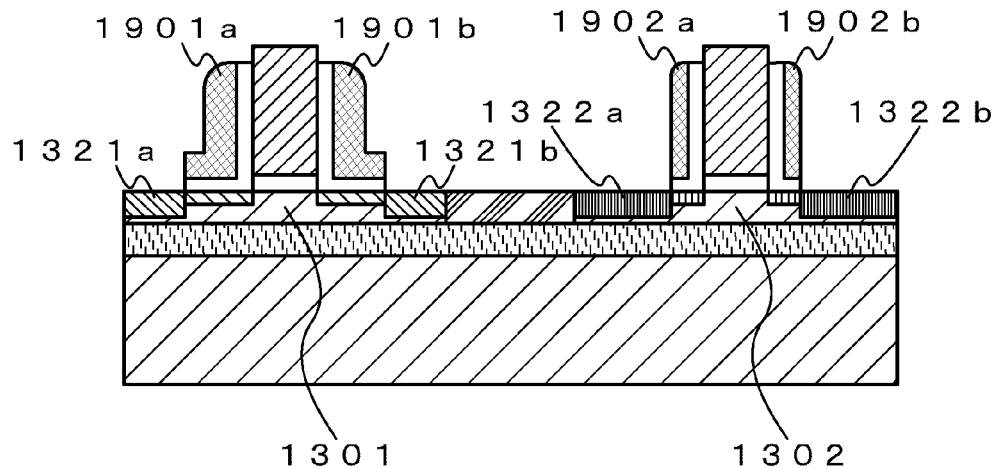
FIGS. 12A to 12C illustrate an example of a method for manufacturing a semiconductor device.

Next, an acceptor element (boron) is selectively added to the island-shaped semiconductor layer 1301 to form a high concentration impurity region 1321a and a high concentration impurity region 1321b (FIG. 12A).

In addition, a donor element (arsenic) is selectively added to the island-shaped semiconductor layer 1302 to form a high concentration impurity region 1322a and a high concentration impurity region 1322b (FIG. 12A).

Here, the reason why not phosphorus but arsenic is added is because arsenic is an element having a low diffusion coefficient used to suppress thermal diffusion in activation treatment.

Note that the addition of the donor element and the acceptor element may occur in reverse order.

If thermal diffusion is not concerned, phosphorus may be used.

Figure 12B:
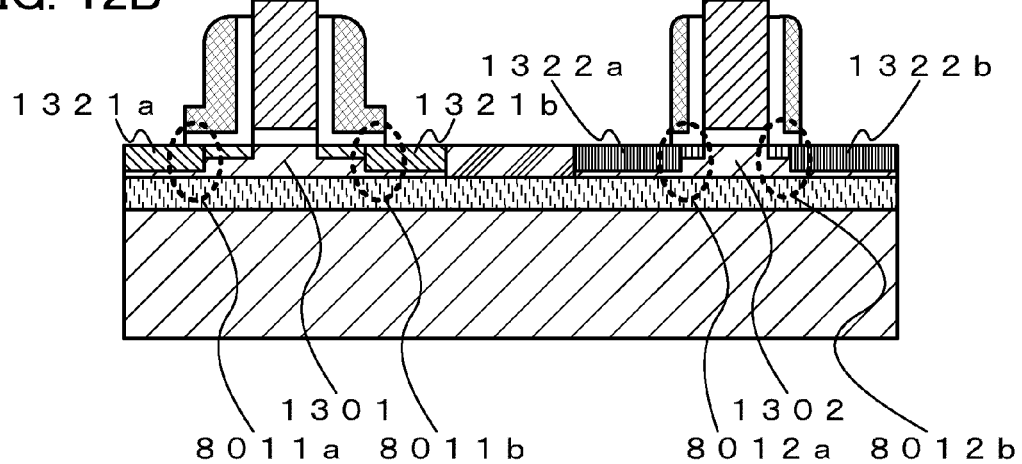

Next, activation treatment is performed (FIG. 12B).

The activation treatment causes thermal diffusion, and diffusion of an impurity element occurs (see dashed lines 8011a and 8011b, dashed lines 8012a and 8012b, and the like in FIG. 12B).

If arsenic having a low diffusion coefficient is added to a transistor having a small width of the sidewalls, the distance of diffusion is reduced; therefore, LDD regions can be prevented from being removed due to diffusion (see the dashed lines 8011a and 8011b, the dashed lines 8012a and 8012b, and the like in FIG. 12B).

Figure 12C:
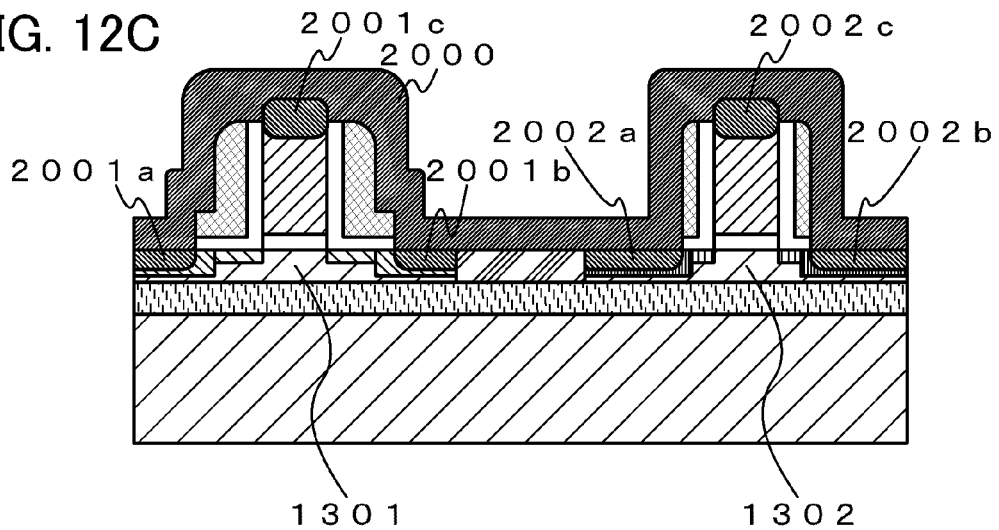

Next, a metal film 2000 is formed and heat treatment is performed to form silicide regions 2001a, 2001b, 2001c, 2002a, 2002b, and 2002c (FIG. 12C).

As the metal film, cobalt, nickel, tungsten, or the like can be used.

Here, the tops of the gate electrodes are projected, whereby the thickness of the silicide regions can be increased.

When the thickness of the silicide regions is increased, the resistance of the gate electrodes can be decreased.

Figure 13A:
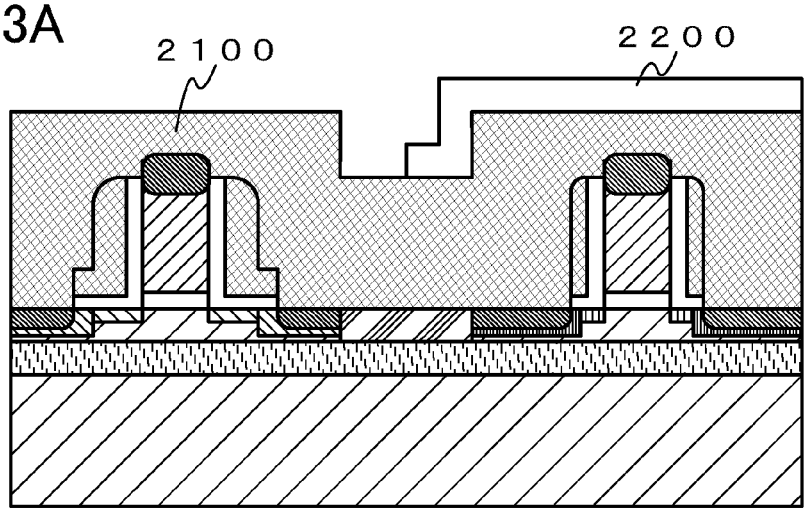
FIGS. 13A to 13C illustrate an example of a method for manufacturing a semiconductor device.

Next, the metal film 2000 is removed, and an interlayer insulating film 2100 is formed over the gate electrode 1701 and the gate electrode 1702, and an interlayer insulating film 2200 is selectively formed over the interlayer insulating film 2100 which is over the gate electrode 1702 (FIG. 13A).

Figure 13B:
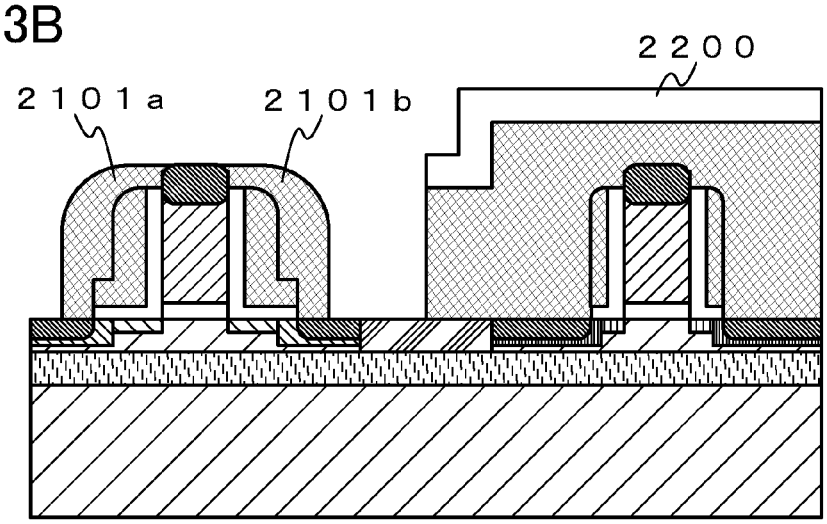

Next, the interlayer insulating film 2200 serves as a mask, and the interlayer insulating film 2100 is etched back to form a sidewall 2101a and a sidewall 2101b (FIG. 13B).

Figure 13C:
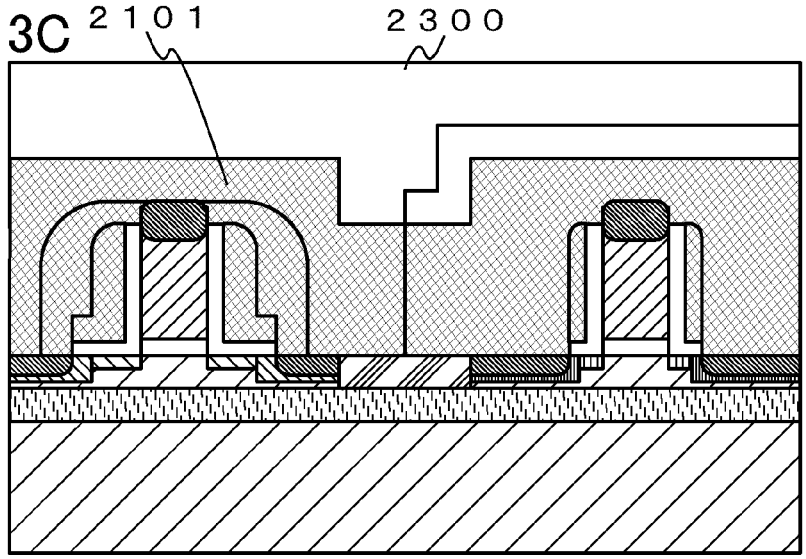

Next, an interlayer insulating film 2101 is selectively formed over the gate electrode 1702, and an interlayer insulating film 2300 is formed over the interlayer insulating film 2101 and the interlayer insulating film 2200 (FIG. 13C).

The interlayer insulating film can be formed using a silicon oxide film, a silicon nitride film, a silicon nitride oxide film, a silicon oxynitride film, polyimide, acrylic, siloxane polymer, or the like.

Note that the interlayer insulating film 2200 serves as a mask and the interlayer insulating film 2100 is etched back; therefore, it is preferable that a material of the interlayer insulating film 2200 be different from a material of the interlayer insulating film 2100.

In addition, when the interlayer insulating film formed over an n-channel transistor has tensile stress and the interlayer insulating film formed over a p-channel transistor has compressive stress, characteristics of the n-channel transistor and the p-channel transistor are improved.

Therefore, it is preferable that the interlayer insulating film 2100 be a film having tensile stress and the interlayer insulating film 2200 be a film having compressive stress (note that the value of tensile stress of the interlayer insulating film 2100 is smaller than that of compressive stress of the interlayer insulating film 2200).

Figure 14A:
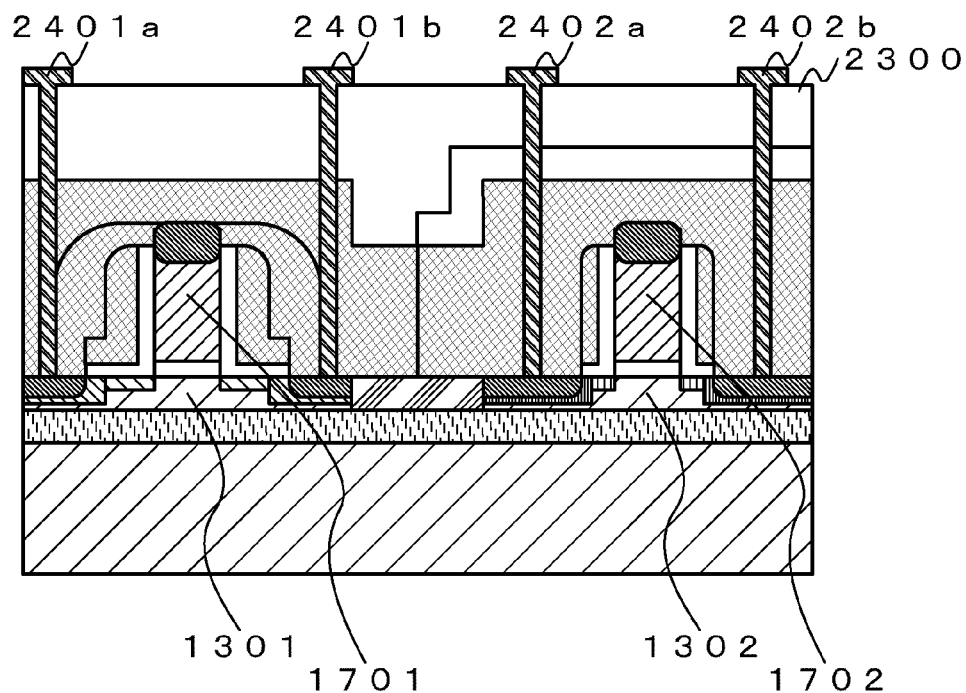
FIGS. 14A and 14B illustrate an example of a method for manufacturing a semiconductor device.

Next, contact holes are formed in the interlayer insulating films to form wirings 2401a, 2401b, 2401c, 2402a, 2402b, and 2402c which are connected to transistors through the contact holes over the interlayer insulating films (FIG. 14A).

Figure 14B:
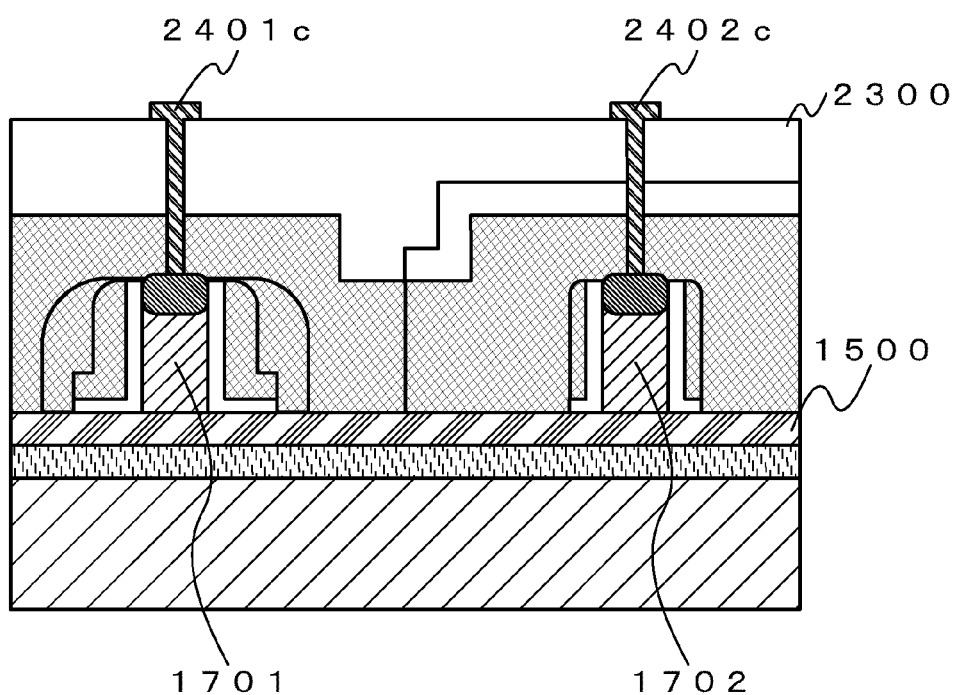

Note that FIGS. 14A and 14B are cross-sectional views illustrating different portions.

Then, contact portions between the gate electrodes and the wirings are portions in which the semiconductor layer is not provided under the gate electrodes (FIG. 14B).

The wirings can be formed using metal such as aluminum, titanium, molybdenum, tungsten, gold, silver, or copper; or a transparent conductive material such as indium tin oxide (ITO).

The wirings may have a single-layer structure or a stacked structure.

This embodiment can be combined with any of the other embodiments.

EXAMPLE 1

The present inventors prepared a plurality of samples each formed using an SOI structure having a base substrate, an insulating layer (bonding layer) formed over the base substrate, and a single crystal semiconductor layer formed over the insulating layer (bonding layer), and they conducted an experiment in measuring concentration of oxygen in each single crystal semiconductor layer by SIMS (secondary ion mass spectrometry) analysis.
(First Description: A Method for Forming Samples)

First, thermal oxidation was performed at 950° C. under an atmosphere including hydrogen chloride, so that a thermally oxidized film having a thickness of 100 nm was formed on a surface of a silicon wafer.

Next, hydrogen was added to the silicon wafer provided with the thermally oxidized film by an ion doping method in which mass separation is not performed.

Note that ion doping was performed under the condition such that a hydrogen gas was used as a doping gas and an acceleration voltage was set to 50 kV.

Next, a base substrate formed of a glass substrate (an AN 100 substrate manufactured by Asahi Glass Co., Ltd.) was prepared.

Then, a surface of the base substrate and a surface of the thermally oxidized film were washed, and then the surface of the base substrate and the surface of the thermally oxidized film were bonded to each other.

Next, heat treatment (for strengthening bonding) was performed at 200° C. for 2 hours, and then heat treatment (for forming a crack) was performed at 600° C. for 2 hours, so that an SOI substrate was formed.

Then, a surface of the single crystal semiconductor layer of the SOI substrate was etched back by a dry etching method.

An average value of the thickness of the single crystal semiconductor layer of the SOI substrate after the etch back was 105 nm.

Note that the average value of the thickness of the single crystal semiconductor layer was calculated in such a way that a plurality of portions was measured using an optical film thickness measurement system (NanoSpec) and the average value of the plurality of portions was used.

Then, a plurality of samples which was formed through the same steps as the above steps was formed.
(Second Description: Types of Samples)

A reference sample is a sample on which irradiation with a laser beam was not performed.

A first sample is a sample in which the single crystal semiconductor layer was irradiated with a laser beam while the base substrate was not heated.

A second sample is a sample in which the single crystal semiconductor layer was irradiated with a laser beam while the temperature of the base substrate was 300° C.

A third sample is a sample in which the single crystal semiconductor layer was irradiated with a laser beam while the temperature of the base substrate was 500° C.

Note that an irradiation atmosphere of the laser beam was a nitrogen atmosphere.

In addition, an excimer laser was used as a laser.

Further, partly melting was performed in irradiation with the laser beam.

In addition, a stage which is in contact with the base substrate was heated, so that the base substrate was subjected to contact heating.
(Third Description: Results of SIMS Measurement)

The SIMS (secondary ion mass spectrometry) analysis was performed to measure oxygen concentration in each single crystal semiconductor layer of the reference sample (without laser irradiation), the first sample (laser irradiation (room temperature)), the second sample (laser irradiation (300° C.)), and the third sample (laser irradiation (500° C.)).

Figure 16:
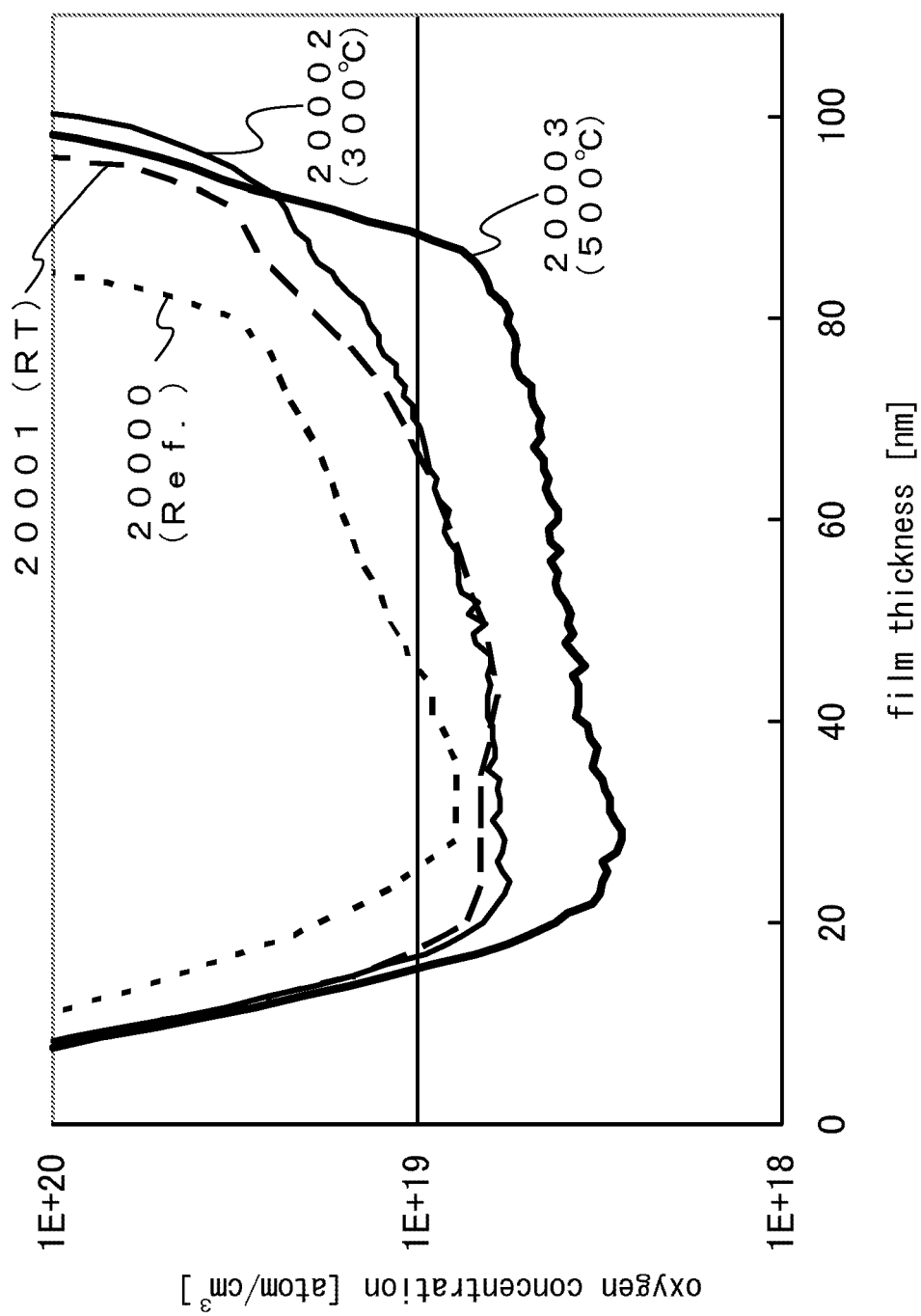
FIG. 16 illustrates an example of results of SIMS analysis.

FIG. 16 illustrates results of the SIMS measurements on the reference sample (without laser irradiation), the first sample (laser irradiation (room temperature)), the second sample (laser irradiation (300° C.)), and the third sample (laser irradiation (500° C.)).

Figure 17:
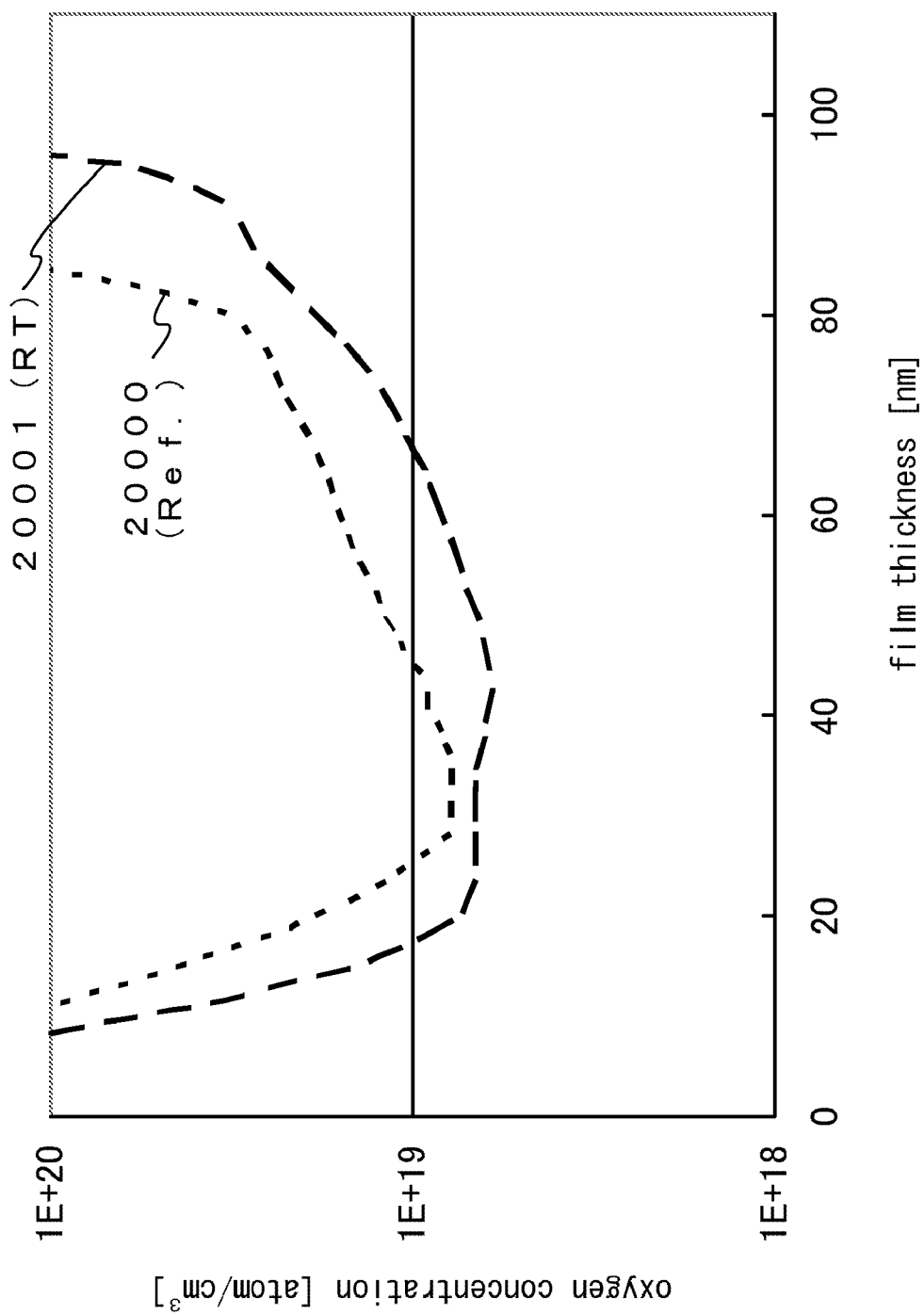
FIG. 17 illustrates an example of results of SIMS analysis.

FIG. 17 illustrates comparison between the reference sample (without laser irradiation) and the first sample (laser irradiation (room temperature)).

Figure 18:
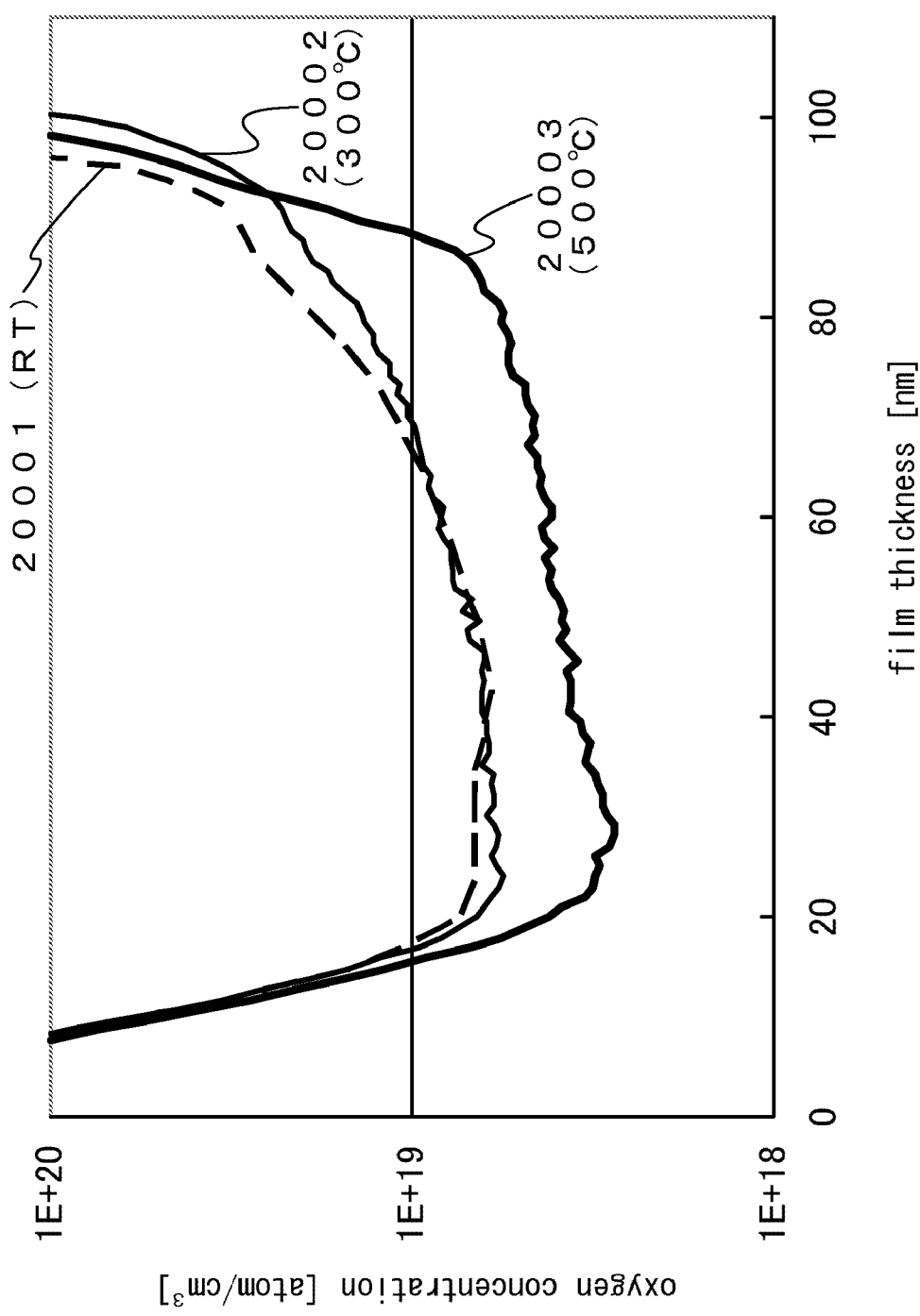
FIG. 18 illustrates an example of results of SIMS analysis.

FIG. 18 illustrates comparison among the first sample (laser irradiation (room temperature)), the second sample (laser irradiation (300° C.)), and the third sample (laser irradiation (500° C.)).

In FIGS. 16 to 18, a line 20000 is a measurement result of the reference sample (without laser irradiation), a line 20001 is a measurement result of the first sample (laser irradiation (room temperature)), a line 20002 is a measurement result of the second sample (laser irradiation (300° C.)), and a line 20003 is a measurement result of the third sample (laser irradiation (500° C.)).

Note that the lines having the same reference numerals in the graphs of FIGS. 16 to 18 are based on the same data.

In addition, in FIGS. 16 to 18, 1E+n (n is a natural number) means 10 to the n-th power.

(Fourth Description: Consideration)

First, how to read the graphs in FIGS. 16 to 18 is described.

As for the oxygen concentration detected by the SIMS analysis, a portion near the surface of the single crystal semiconductor layer (a portion with a thickness range of 0 nm to 20 nm in the graphs) and a portion near the interface between the single crystal semiconductor layer and the bonding layer (a portion with a thickness range of 80 nm to 105 nm in the graphs) are regions where measurement accuracy is usually low. Therefore, these portions are not used as a reference in the case where the oxygen concentration in the single crystal semiconductor layer is compared.

It is thought that the reason why measurement accuracy is low is the influence of a knock-on effect, unevenness on the surface of the single crystal semiconductor layer, contamination on the surface of the single crystal semiconductor layer, or the like (the contamination is thought to be caused by the fact that a SIMS apparatus is placed outside a clean room that is a clean atmosphere and the samples are taken out from the clean atmosphere for the SIMS analysis).

Therefore, the oxygen concentration of a portion with a thickness range of 20 nm to 80 nm in the graphs may be compared.

First, it is found that, when the reference sample without laser irradiation is compared with the first to third samples on which laser irradiation was performed, the oxygen concentration is reduced by at least irradiation with a laser beam (see FIG. 16).

It is found in particular that, even when the reference sample without laser irradiation is compared with the first sample irradiated with the laser beam at room temperature, the oxygen concentration is reduced, so that an effect of reducing the oxygen concentration can be obtained without the substrate being heated (see FIGS. 16 and 17).

Next, the first sample (laser irradiation (room temperature)), the second sample (laser irradiation (300° C.)), and the third sample (laser irradiation (500° C.)) are compared (see FIGS. 16 and 18).

There is little difference in the oxygen concentration between the first sample (laser irradiation (room temperature)) and the second sample (laser irradiation (300° C.)).

On the other hand, it is found that the oxygen concentration of the third sample (laser irradiation (500° C.)) is reduced as compared with the first sample (laser irradiation (room temperature)) and the third sample (laser irradiation (500° C.)).

Therefore, it is found that, when laser irradiation is performed in a state that at least the temperature of the base substrate is 500° C., the oxygen concentration is reduced.

From the above results, the present inventors thought that the reason why the oxygen concentration is reduced due to laser irradiation is because the single crystal semiconductor layer is in a melted state having a high diffusion coefficient of oxygen, so that the outward diffusion of oxygen is promoted to reduce the oxygen concentration.

In addition, the present inventors thought that the reduction of oxygen is not remarkable when the substrate is heated at 300° C. but the reduction of oxygen is remarkable when the substrate is heated at 500° C., so that as the time of retaining a melted state having a high diffusion coefficient is longer, the outward diffusion of oxygen is promoted.

Accordingly, it is apparent that as the heating temperature of the substrate is higher, the time of retaining a melted state is lengthened; therefore, it is apparent that reduction of oxygen is promoted when the substrate is heated at a temperature higher than 500° C.

Therefore, it can be said that when at least laser irradiation is performed, the outward diffusion of oxygen occurs, whereby the oxygen concentration can be reduced.

It can also be said that when laser irradiation is performed while heating is performed at a temperature higher than or equal to 500° C., the outward diffusion of oxygen can be encouraged.

(Fifth Description: As for an Ion Doping Method)

The silicon wafer used for forming the samples was a silicon wafer in which the oxygen concentration is controlled to be $1.0 \times 10^{18}$ atom/cm$^3$ to $2.0 \times 10^{18}$ atom/cm$^3$.

However, the oxygen concentration in the single crystal semiconductor layer of the reference sample was a value higher than $2.0 \times 10^{18}$ atom/cm$^3$.

Accordingly, it is apparent that the oxygen concentration was increased in a process of manufacturing the SOI substrate.

One of the reasons why the oxygen concentration was increased is because hydrogen was added by an ion doping method in which mass separation is not performed.

That is, in the case where mass separation was not performed, all the elements in an atmosphere in a treatment chamber for ion doping were ionized to be introduced.

In addition, there is a large amount of oxygen in the air; therefore, it is difficult to control the atmosphere in the chamber so as to perfectly prevent the mixing of the oxygen into the treatment chamber.

Therefore, in the case where hydrogen was added by an ion doping method in which mass separation is not performed, the single crystal semiconductor layer was doped with oxygen at the same time.

This application is based on Japanese Patent Application serial No. 2008-318377 filed with Japan Patent Office on Dec. 15, 2008, the entire contents of which are hereby incorporated by reference.

What is claimed is:

1. A method for manufacturing an SOI substrate, comprising the steps of:
    forming an SOI structure including a base substrate, a bonding layer including oxygen over the base substrate, and a single crystal semiconductor layer over the bonding layer including oxygen; and
    melting a part of the single crystal semiconductor layer by irradiation with a laser beam while the base substrate is heated at a temperature of higher than or equal to 500° C. and lower than a melting point of the base substrate,
    wherein an irradiation atmosphere of the laser beam includes a reducing gas.

2. The method for manufacturing an SOI substrate according to claim 1, wherein an irradiation atmosphere of the laser beam is a reduced-pressure atmosphere.

3. The method for manufacturing an SOI substrate according to claim 1, wherein an irradiation atmosphere of the laser beam includes a hydrogen fluoride gas.

4. The method for manufacturing an SOI substrate according to claim 3, wherein the SOI structure is exposed to an atmosphere including the hydrogen fluoride gas after formation of the SOI structure and before irradiation with the laser beam.

5. The method for manufacturing an SOI substrate according to claim 1, wherein the base substrate is heated by one of light irradiation and induction heating when the laser beam is emitted.

6. The method for manufacturing an SOI substrate according to claim 1, wherein the single crystal semiconductor layer is formed in such a manner that an embrittlement region is formed in a single crystal semiconductor substrate by an ion doping method in which mass separation is not performed and then the embrittlement region is subjected to heat treatment to separate a portion of the single crystal semiconductor substrate.

7. The method for manufacturing a semiconductor device, wherein a semiconductor element is formed using the SOI substrate according to claim 1.

8. A method for manufacturing an SOI substrate, comprising the steps of:
    forming an SOI structure including a base substrate, a bonding layer including oxygen over the base substrate, and a single crystal semiconductor layer over the bonding layer including oxygen; and
    melting a part of the single crystal semiconductor layer by irradiation with a laser beam while the base substrate is heated at a temperature of higher than or equal to 500° C. and lower than a melting point of the base substrate,
    wherein an irradiation atmosphere of the laser beam includes a reducing gas,
    wherein the part of the single crystal semiconductor layer is not in contact with the bonding layer.

9. The method for manufacturing an SOI substrate according to claim 8, wherein an irradiation atmosphere of the laser beam is a reduced-pressure atmosphere.

10. The method for manufacturing an SOI substrate according to claim 8, wherein an irradiation atmosphere of the laser beam includes a hydrogen fluoride gas.

11. The method for manufacturing an SOI substrate according to claim 10, wherein the SOI structure is exposed to an atmosphere including the hydrogen fluoride gas after formation of the SOI structure and before irradiation with the laser beam.

12. The method for manufacturing an SOI substrate according to claim 8, wherein the base substrate is heated by one of light irradiation and induction heating when the laser beam is emitted.

13. The method for manufacturing an SOI substrate according to claim 8, wherein the single crystal semiconductor layer is formed in such a manner that an embrittlement region is formed in a single crystal semiconductor substrate by an ion doping method in which mass separation is not performed and then the embrittlement region is subjected to heat treatment to separate a portion of the single crystal semiconductor substrate.

14. The method for manufacturing a semiconductor device, wherein a semiconductor element is formed using the SOI substrate according to claim 8.

15. A method for manufacturing an SOI substrate, comprising the steps of:
    forming an SOI structure including a base substrate, a bonding layer including oxygen over the base substrate, and a single crystal semiconductor layer over the bonding layer including oxygen;
    etching back the single crystal semiconductor layer; and
    melting a part of the single crystal semiconductor layer by irradiation with a laser beam while the base substrate is heated at a temperature of higher than or equal to 500° C. and lower than a melting point of the base substrate,
    wherein after the etching back step and before the melting step, an average value of a thickness of the single crystal semiconductor layer is greater than or equal to 100 nm.

16. The method for manufacturing an SOI substrate according to claim 15, wherein an irradiation atmosphere of the laser beam is a reduced-pressure atmosphere.

17. The method for manufacturing an SOI substrate according to claim 15, wherein an irradiation atmosphere of the laser beam includes a reducing gas.

18. The method for manufacturing an SOI substrate according to claim 15, wherein an irradiation atmosphere of the laser beam includes a hydrogen fluoride gas.

19. The method for manufacturing an SOI substrate according to claim 18, wherein the SOI structure is exposed to an atmosphere including the hydrogen fluoride gas after formation of the SOI structure and before irradiation with the laser beam.

20. The method for manufacturing an SOI substrate according to claim 15, wherein the base substrate is heated by one of light irradiation and induction heating when the laser beam is emitted.

21. The method for manufacturing an SOI substrate according to claim 15, wherein the single crystal semiconductor layer is formed in such a manner that an embrittlement region is formed in a single crystal semiconductor substrate by an ion doping method in which mass separation is not performed and then the embrittlement region is subjected to heat treatment to separate a portion of the single crystal semiconductor substrate.

22. The method for manufacturing a semiconductor device, wherein a semiconductor element is formed using the SOI substrate according to claim 15.

* * * * *